United States Patent [19]

Saitoh

[11] Patent Number: 5,631,474
[45] Date of Patent: May 20, 1997

[54] LIGHT EMITTING ELEMENT AND ARRAY OF LIGHT EMITTING ELEMENTS FOR LIGHT SOURCE

[75] Inventor: Tetsurou Saitoh, Sendai, Japan

[73] Assignee: Ricoh Company, Ltd., Tokyo, Japan

[21] Appl. No.: 554,682

[22] Filed: Nov. 7, 1995

[30] Foreign Application Priority Data

Nov. 11, 1994 [JP] Japan ................................ 6-303161

[51] Int. Cl.$^6$ .................................................. H01L 33/00
[52] U.S. Cl. .................... 257/88; 257/95; 257/96; 257/98
[58] Field of Search ........................... 257/13, 88, 94, 257/95, 96, 91, 98

[56] References Cited

U.S. PATENT DOCUMENTS

| | | | |
|---|---|---|---|
| 5,373,173 | 12/1994 | Ohata et al. | 257/88 |
| 5,428,227 | 6/1995 | Satoh | 257/95 |
| 5,498,883 | 3/1996 | Lebby et al. | 257/95 |

FOREIGN PATENT DOCUMENTS

| | | | |
|---|---|---|---|
| 63-132487 | 6/1988 | Japan | 257/95 |
| 63-271981 | 11/1988 | Japan | 257/95 |
| 5-58272 | 8/1993 | Japan | 257/95 |

*Primary Examiner*—Minh-Loan Tran
*Attorney, Agent, or Firm*—Cooper & Dunham LLP

[57] ABSTRACT

A light emitting element has plural semiconductor layers including a light emitting layer and formed on one principal surface of a semiconductor substrate, and is constructed such that at least one portion of end faces of the plural semiconductor layers including the light emitting layer is set to a light emitting end face. Plural light emitting end faces are formed in the light emitting element. Angles formed between mutual adjacent end faces of the respective light emitting end faces are set such that lights emitted from at least two light emitting end faces among the plural light emitting end faces are mutually synthesized. Accordingly, lights from the plural light emitting end faces can be synthesized and emitted. As a result, an amount of light emitted in a forward direction of the light emitting element and an output of this light can be increased. Accordingly, coupling efficiency of the light emitting element and an optical fiber can be improved and a reduction in light emitting efficiency can be effectively prevented.

7 Claims, 22 Drawing Sheets

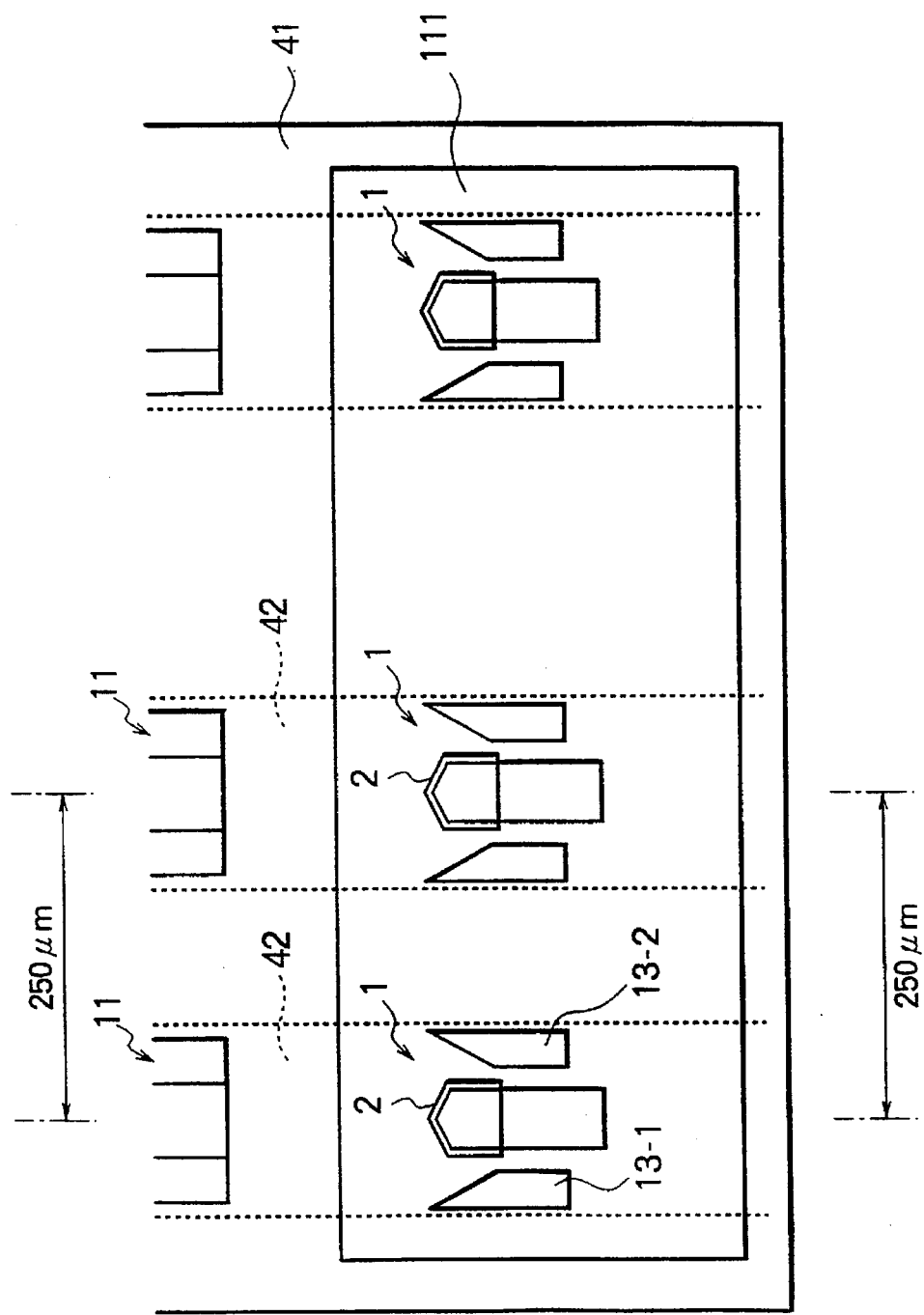

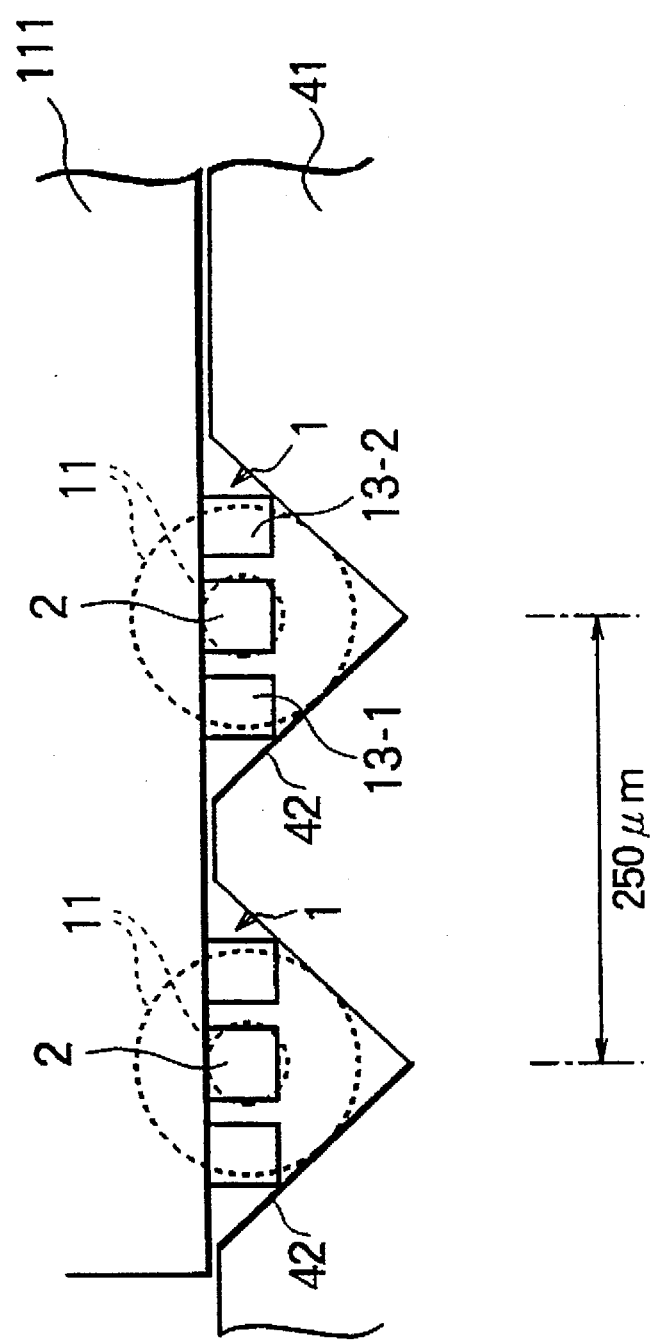

LIGHT EMITTING ELEMENT AND ARRAY OF LIGHT EMITTING ELEMENTS FOR LIGHT SOURCE

BACKGROUND OF THE INVENTION

1. Field of the Invention

The present invention relates to a light emitting element, an array-shaped light source and a manufacturing method thereof, and an optical signal transmitter used in a light source for a lighting device, etc., or a communication device using optical fibers, etc.

2. Description of the Related Art

A parallel transmission system attracts public attention as a transmission system of data by progress of a recent optical communication technique. In this parallel transmission system, a large amount of information is not transmitted at a high speed by a single optical fiber, but data are transmitted in parallel by using many optical fibers.

In such a parallel transmission system, data can be divided in parallel and transmitted. Accordingly, when information is transmitted at the same information transmitting speed, a data transmitting speed per optical fiber can be reduced in comparison with a case in which data are transmitted by one optical fiber. Further, when data are transmitted by one optical fiber, the data are normally transmitted after processings such as parallel-serial conversion, coding of these data, etc. It is also necessary to perform decoding and serial-parallel conversion of received data. However, in the parallel transmission system, parallel data can be transmitted as they are. After these parallel data are received, these data can be used as they are. Therefore, the parallel transmission system can be simplified.

In such a parallel transmission system, it is effective to integrate light emitting elements as light sources in an array shape so as to simplify coupling of the light emitting elements and optical fibers and make the parallel transmission system compact, etc. It is considered to keep characteristics of such parallel transmission that a light emitting diode (LED) is used as a kind of light emitting element since the light emitting diode is easily treated and has high safety in comparison with a laser diode. The light emitting diode is used in fields of a small-scale LAN, data transmission within a device, HA within home, etc. in which the information transmission speed may be reduced in comparison with a trunk system line, etc.

It is advantageous to use an edge emitting LED as the light emitting diode in comparison with a surface emitting LED in coupling of the LED and an optical fiber. In the edge emitting LED, light emitting efficiency is generally high in comparison with the surface emitting LED and directivity of light in a direction perpendicular to a substrate can be strengthened by using a hetero structure, etc. Accordingly, future utilization and enlargement of the edge emitting LED are expected as a light emitting element for parallel transmission.

Light emitting power of the light emitting diode is small in comparison with the laser diode so that high coupling efficiency of the light emitting diode and an optical fiber is required.

When the light emitting diode is used as a light emitting element, a light emitting diode of a surface emitting type is generally proposed to increase coupling efficiency of the light emitting diode and an optical fiber. For example, this light emitting diode is shown in Japanese Patent Publication (KOKOKU) No. 5-58272. In FIG. 1 showing this light emitting diode, a spherical lens 202 is arranged on a light taking-out portion of a light emitting element 201.

Each of Japanese Patent Application Laying Open (KOKAI) Nos. 63-132487 and 63-271981 shows a technique for improving the coupling efficiency of the light emitting diode and an optical fiber by processing a light emitting facet of the light emitting diode of an edge emitting type with predetermined curvature so that the light emitting diode functions as a cylindrical lens or a spherical lens.

FIG. 2 is a view showing one example of the light emitting diode shown in Japanese Patent Application Laying Open (KOKAI) No. 63-132487. In this light emitting diode, a light emitting face 206 is formed in a semi-circular shape by a photolithographic process and etching so that the light emitting diode functions as a cylindrical lens on the light emitting face 206. Light 207 emitted from the light emitting face 206 is converged at an end of an optical fiber so as to increase the coupling efficiency of the light emitting diode and the optical fiber.

Each of FIGS. 3a and 3b is a view showing one example of the light emitting element shown in Japanese Patent Application Laying Open (KOKAI) No. 63-271981. In the light emitting diode shown in FIG. 3a, a light emitting facet of this diode is formed by a photolithographic process and dry etching and a projecting portion 208 is formed with predetermined curvature so that the light emitting diode functions as a cylindrical lens. In the light emitting diode shown in FIG. 3b, a projecting portion 209 having a spherical shape is formed on a light emitting facet of this diode so that the light emitting diode functions as a spherical lens.

However, in the light emitting diode as shown in Japanese Patent Application Laying Open (KOKAI) No. 5-58272, the lens 202 must be arranged as a part separated from the light emitting element 201 so that the number of parts is increased. Further, an assembling process of this lens 202 is required. Therefore, manufacturing cost of the light emitting diode is increased and a process for manufacturing the light emitting diode is complicated.

In the examples shown in Japanese Patent Application Laying Open (KOKAI) Nos. 63-132487 and 63-271981, the light emitting facet is processed in the shape of a curved surface or a spherical shape so that the light emitting diode functions as a lens. In this case, light emission must be restrained approximately on the light emitting facet of the curved surface shape providing lens effects. Namely, as shown in FIG. 4a, when a light emitting region is formed at a portion 208 near the light emitting facet of the curved surface shape providing the lens effects, a light component of diffuse light spontaneous, emitting light 209 near the light emitting facet of the curved surface shape is emitted from an entire region of the light emitting facet of the curved surface shape so that the lens effects are greatly reduced. Accordingly, to effectively show the lens effects, it is necessary to emit light only in a limited light emitting region 211 as shown in FIG. 4b by restraining light emission in a portion 210 near the light emitting facet of the curved surface shape providing the lens effects without forming this near portion 210 in a light emitting region.

In accordance with the construction shown in FIG. 4b, light emitted in the limited light emitting region 211 is guided to the portion 210 near the light emitting facet of the curved surface shape in which light emission is restrained. This light is then converged as lens effects in this portion 210 so that a desirable shape of the emitted light can be obtained. However, in this case, the portion 210 near the light emitting facet of the curved surface shape restraining the light emission becomes an absorption layer with respect to light emitted in the light emitting region 211 so that an amount (emitting efficiency) of light emitted from this light emitting element is reduced. Namely, in the case of FIG. 4b, coupling efficiency of the light emitting element and an optical fiber can be improved, but light emitting efficiency is reduced. Therefore, an electric current injected into the light emitting element must be increased to maintain the light emitting efficiency so that power consumption of a signal transmitting unit is increased and the light emitting element is easily degraded.

SUMMARY OF THE INVENTION

It is therefore an object of the present invention to provide a light emitting element, an array-shaped light source and a manufacturing method thereof, and an optical signal transmitter capable of improving coupling efficiency of the light emitting element and an optical fiber and effectively preventing light emitting efficiency from being reduced.

In accordance with a first construction of the present invention, the above object can be achieved by a light emitting element comprising plural semiconductor layers including a light emitting layer and formed on one principal surface of a semiconductor substrate, and constructed such that at least one portion of end faces of the plural semiconductor layers including the light emitting layer is set to a light emitting end face;

plural light emitting end faces are formed in the light emitting element; and angles formed between mutual adjacent end faces of the respective light emitting end faces are set such that lights emitted from at least two light emitting end faces among the plural light emitting end faces are mutually synthesized. Accordingly, lights from the plural light emitting end faces can be synthesized and emitted. As a result, an amount of light emitted in a forward direction of the light emitting element and an output of this light can be increased. Accordingly, the synthetic light of this light emitting element can be incident to an optical fiber with high efficiency so that coupling efficiency of the light emitting element and the optical fiber can be increased.

In accordance with a second construction of the present invention, the semiconductor layers have five end faces and at least two end faces among these five end faces are set to light emitting end faces. Therefore, an electrode forming portion can be formed by separating the electrode forming portion from the light emitting end faces even when the light emitting element has a small area (volume). Accordingly, this light emitting element is suitable for a compact structure. Further, coupling efficiency of the light emitting element and the optical fiber can be increased although the light emitting element is suitable for a compact structure.

In accordance with a third construction of the present invention, the semiconductor layers have three end faces and at least two end faces among these three end faces are set to light emitting end faces. Accordingly, an area of each of the light emitting end faces can be increased with respect to a volume of the light emitting element so that light emitting efficiency of the light emitting element is high and the light emitting element is suitably made compact.

In accordance with a fourth construction of the present invention, the plural semiconductor layers including the light emitting layer and formed on one principal surface of the semiconductor substrate satisfy the following relation $Eg2 > Eg1$ and $Eg3 > Eg1$ when $Eg1$ is set to band gap energy of the light emitting layer and $Eg2$ and $Eg3$ are set to band gap energies of layers located on both sides of the light emitting layer. Each of these both side layers has a double hetero layer structure of first and second conductivity types. Accordingly, a far field pattern is narrowed by confinement of light in a vertical direction. The far field pattern is widened in a horizontal direction since there is no confinement of light in the horizontal direction. Thus, coupling efficiency of the light emitting element and an optical fiber can be increased by synthesis of light in the horizontal direction.

In accordance with a fifth construction of the present invention, when synthetic light of lights emitted from at least two light emitting end faces among the plural light emitting end faces is directed in a forward direction of the semiconductor layers, a structure for light interruption for preventing light emitted from each of the light emitting end faces from being stray light is arranged on each of sides of the semiconductor layers. Accordingly, a light component on a side of the light emitting element among synthetic light of lights from the plural light emitting end faces can be interrupted on a light interrupting plane. Thus, coupling efficiency of the light emitting element and an optical fiber can be increased and crosstalk of light can be reduced.

In accordance with a sixth construction of the present invention, the angle of a partial plane of the structure for light interruption is set such that light from each of the light emitting end faces is directed forward and reflected on this plane when this light is incident to this plane. The structure for light interruption functions as a structure for reflection having a plane for light reflection. Accordingly, a light component on a side of the light emitting element among synthetic light of lights from the plural light emitting end faces can be deflected on a light reflecting plane in a forward direction of the light emitting element. Thus, coupling efficiency of the light emitting element and an optical fiber can be further increased and crosstalk of light can be reduced.

In accordance with a seventh construction of the present invention, the above object can be also achieved by an array-shaped light source in which light emitting elements each having high coupling efficiency to an optical fiber are precisely aligned with each other.

In accordance with an eighth construction of the present invention, the above object can be also achieved by a method for manufacturing an array-shaped light source by aligning plural light emitting elements with each other. Each of the plural light emitting elements comprises plural semiconductor layers including a light emitting layer and formed on one principal surface of a semiconductor substrate, and is constructed such that at least one portion of end faces of the plural semiconductor layers including the light emitting layer is set to a light emitting end face. Plural light emitting end faces are formed in the light emitting element. Angles formed between mutual adjacent end faces of the respective light emitting end faces are set such that lights emitted from at least two light emitting end faces among the plural light emitting end faces are mutually synthesized. The manufacturing method comprises the steps of growing a crystal growth layer including at least a double hetero layer structure as an epitaxial crystal on one principal surface of the semiconductor substrate; and etching the crystal growth layer by photolithography by using an etching mask having a shape for suitably aligning the crystal growth layer in an array shape so that the semiconductor layers are formed. Accordingly, the plural light emitting end faces of the semiconductor layers can be formed simultaneously, precisely and easily. Therefore, an array-shaped light source having high coupling efficiency to an optical fiber can be easily made.

In accordance with a ninth construction of the present invention, a structure for reflection or a structure for light interruption in addition to the semiconductor layers is suitably aligned in an array shape with the etching mask. The array-shaped light source having the light emitting elements aligned with each other in an array shape and the structure for reflection or light interruption is manufactured by using the etching mask. Accordingly, the plural light emitting end faces of the semiconductor layers and the structure for light interruption or reflection can be formed simultaneously, precisely and easily. Further, it is possible to easily make an array-shaped light source with high coupling efficiency to an optical fiber and reduced crosstalk of light.

In accordance with a tenth construction of the present invention, the above object can be also achieved by an optical signal transmitter in which a groove for aligning an optical fiber is formed on a predetermined substrate. The optical fiber and a light emitting element are fitted into the groove. The light emitting element and the optical fiber are arranged such that a light emitting face of the light emitting element and a light receiving face of the optical fiber are aligned with each other within the groove. Accordingly, an optical transmitter having high performance can be precisely assembled by a simple process.

Further objects and advantages of the present invention will be apparent from the following description of the preferred embodiments of the present invention as illustrated in the accompanying drawings.

Figure 1:
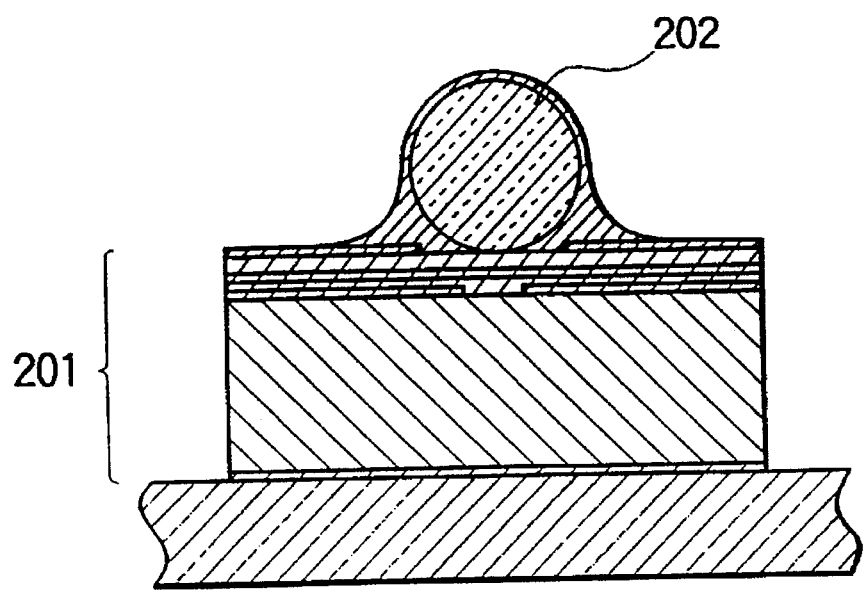
FIG. 1 is a view showing a general light emitting element.
Figure 2:
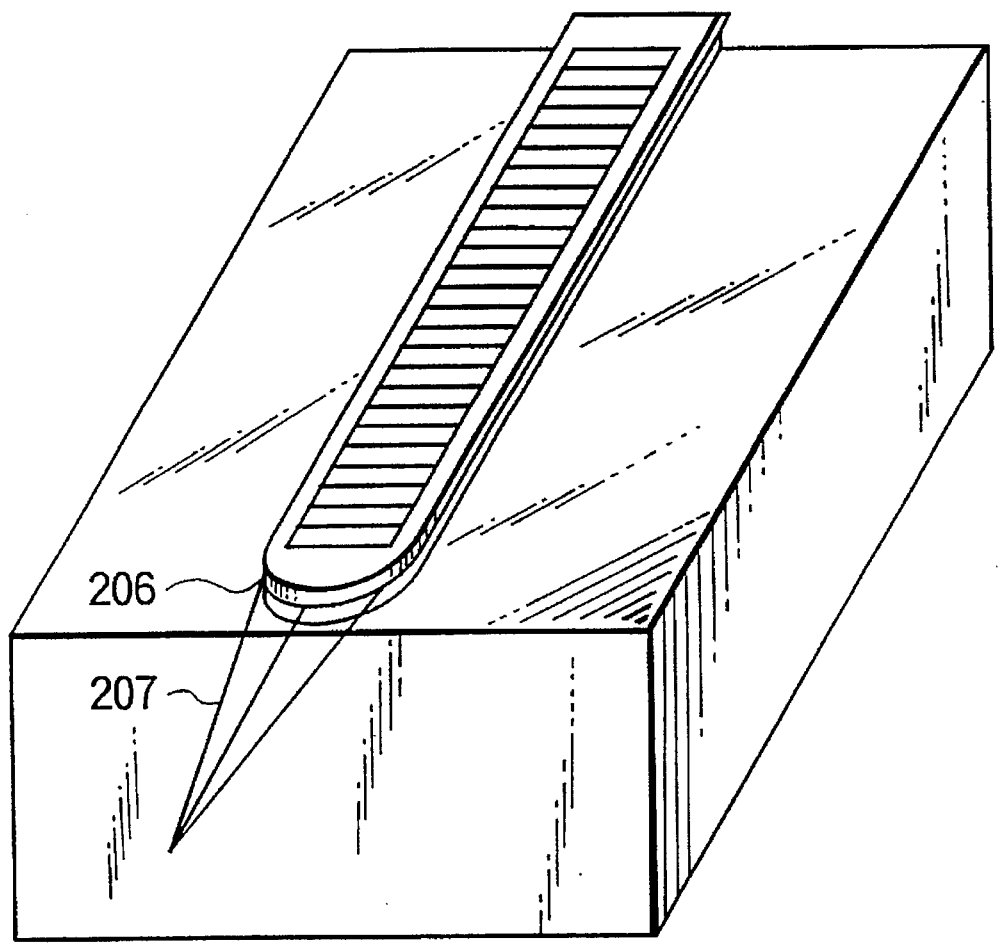
FIG. 2 is a view showing a general light emitting element.
Figure 3A:
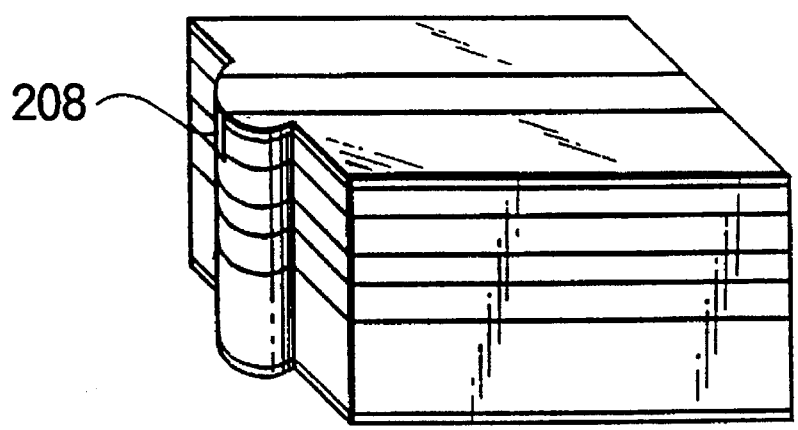
Figure 3B:
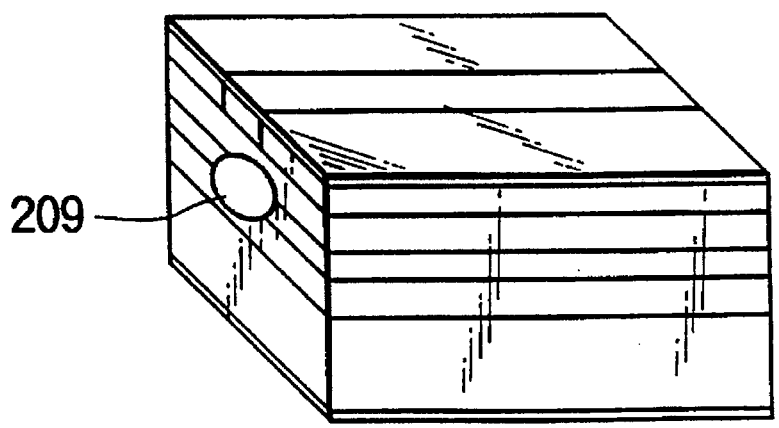
Figure 4A:
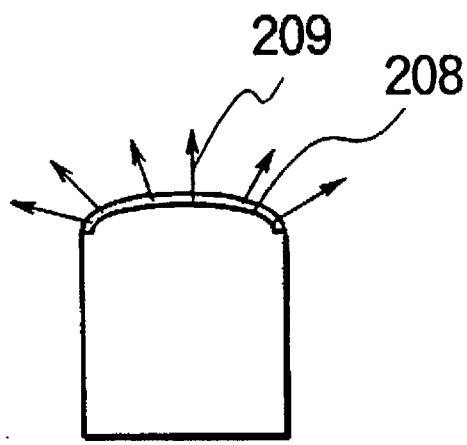
Figure 4B:
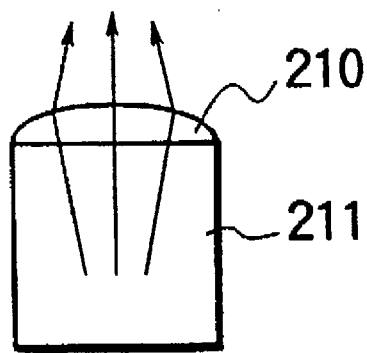
Figure 5:
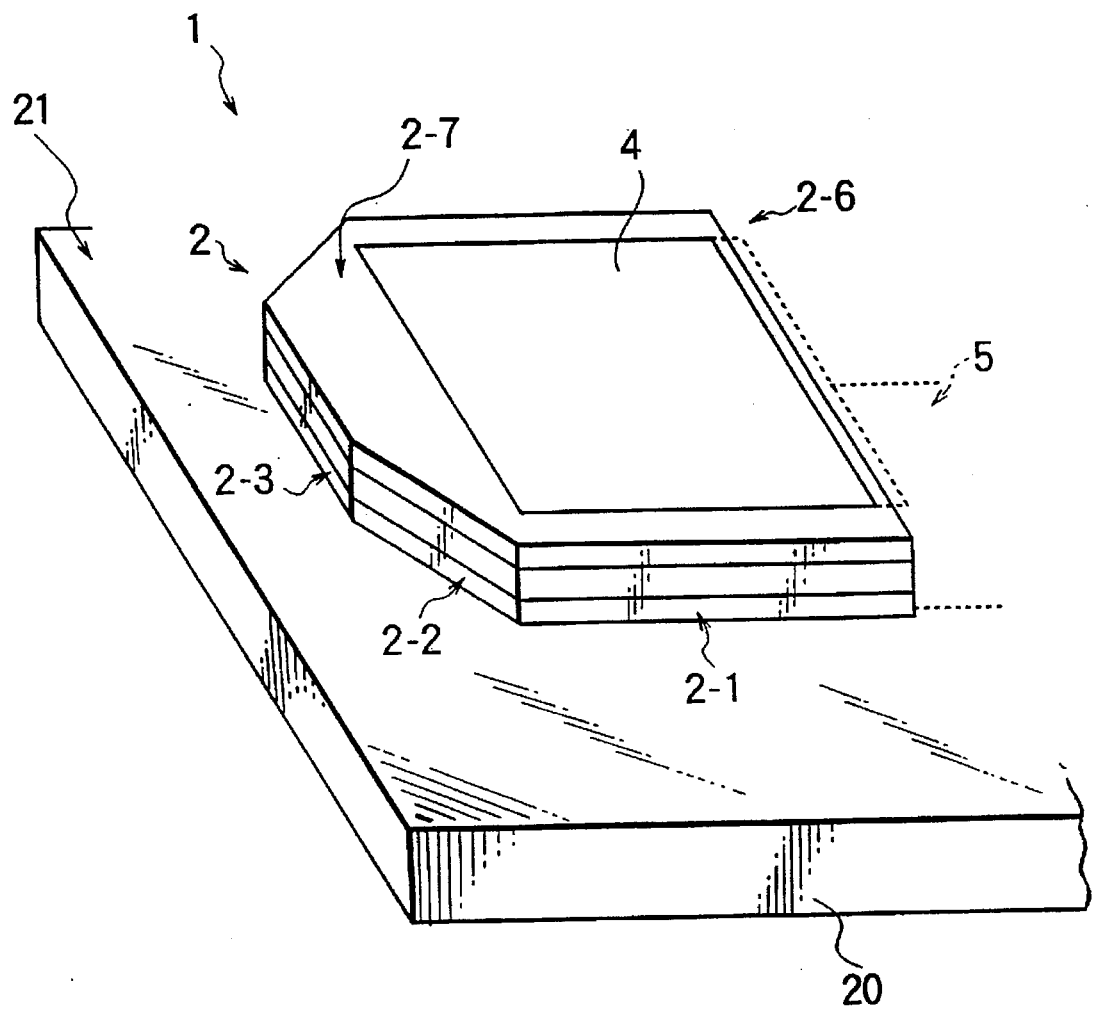
Figure 6:
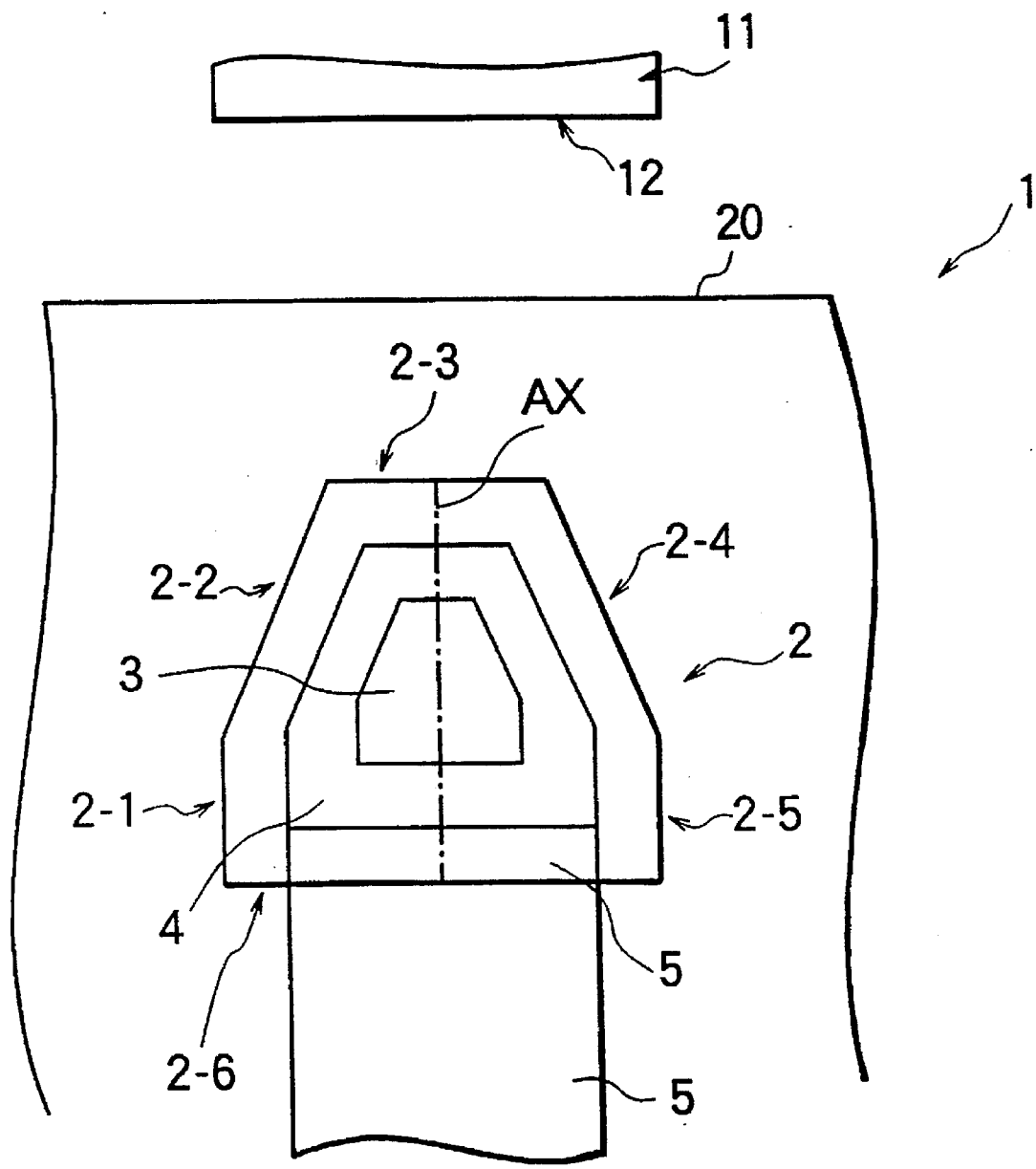
Figure 7:
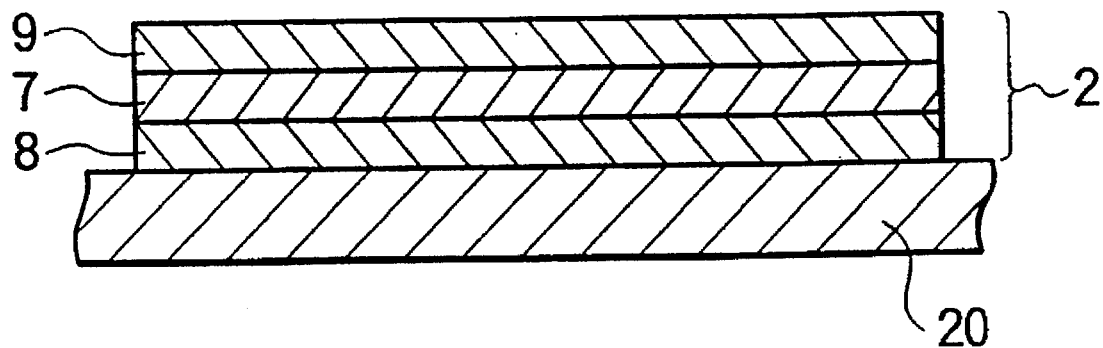
Figure 8:
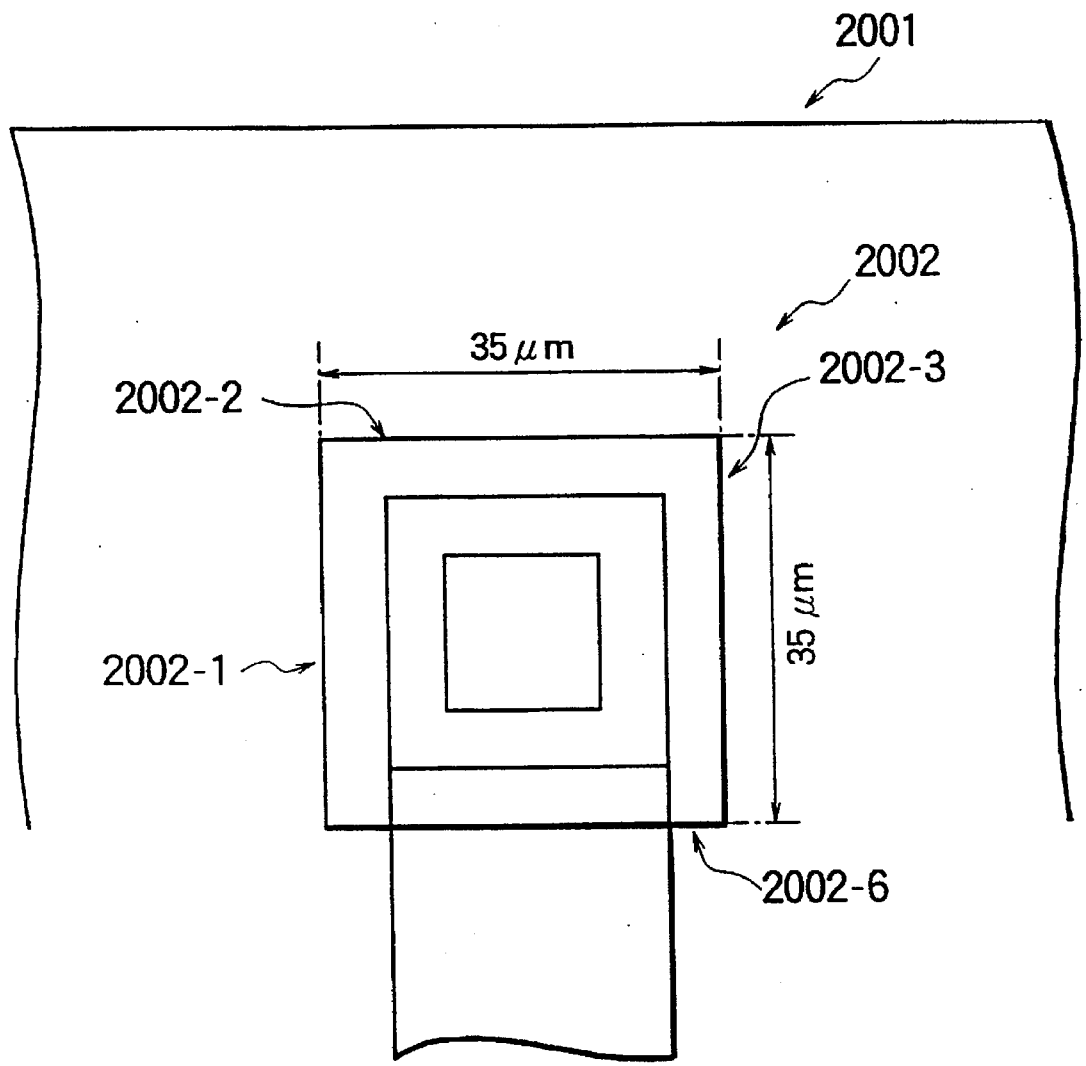
Figure 9:
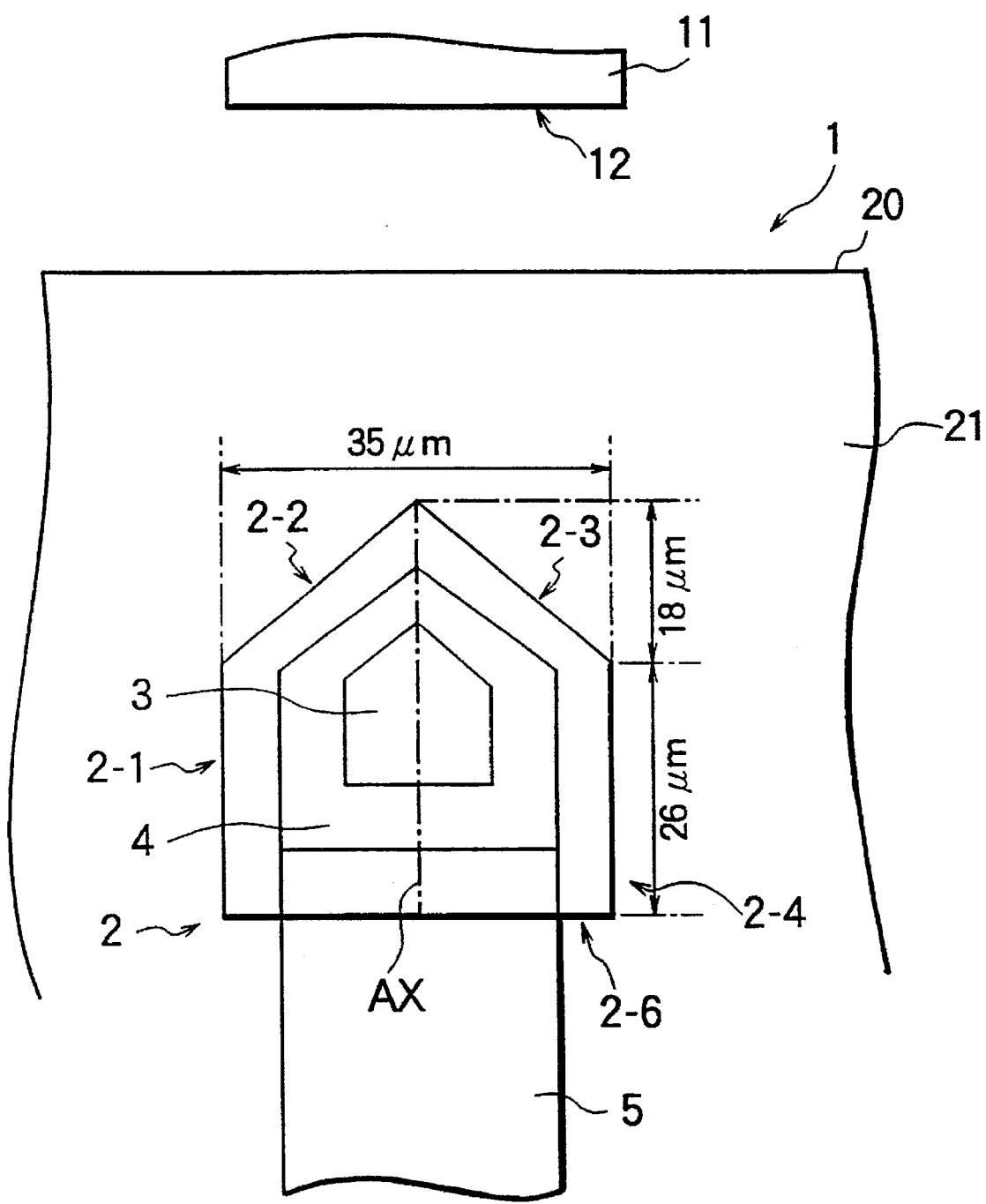
Figure 10:
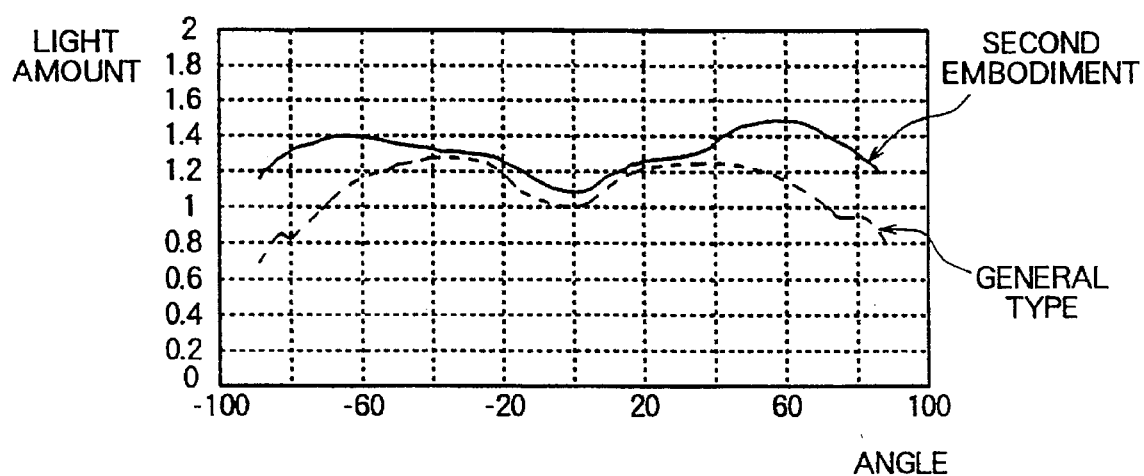
Figure 11:
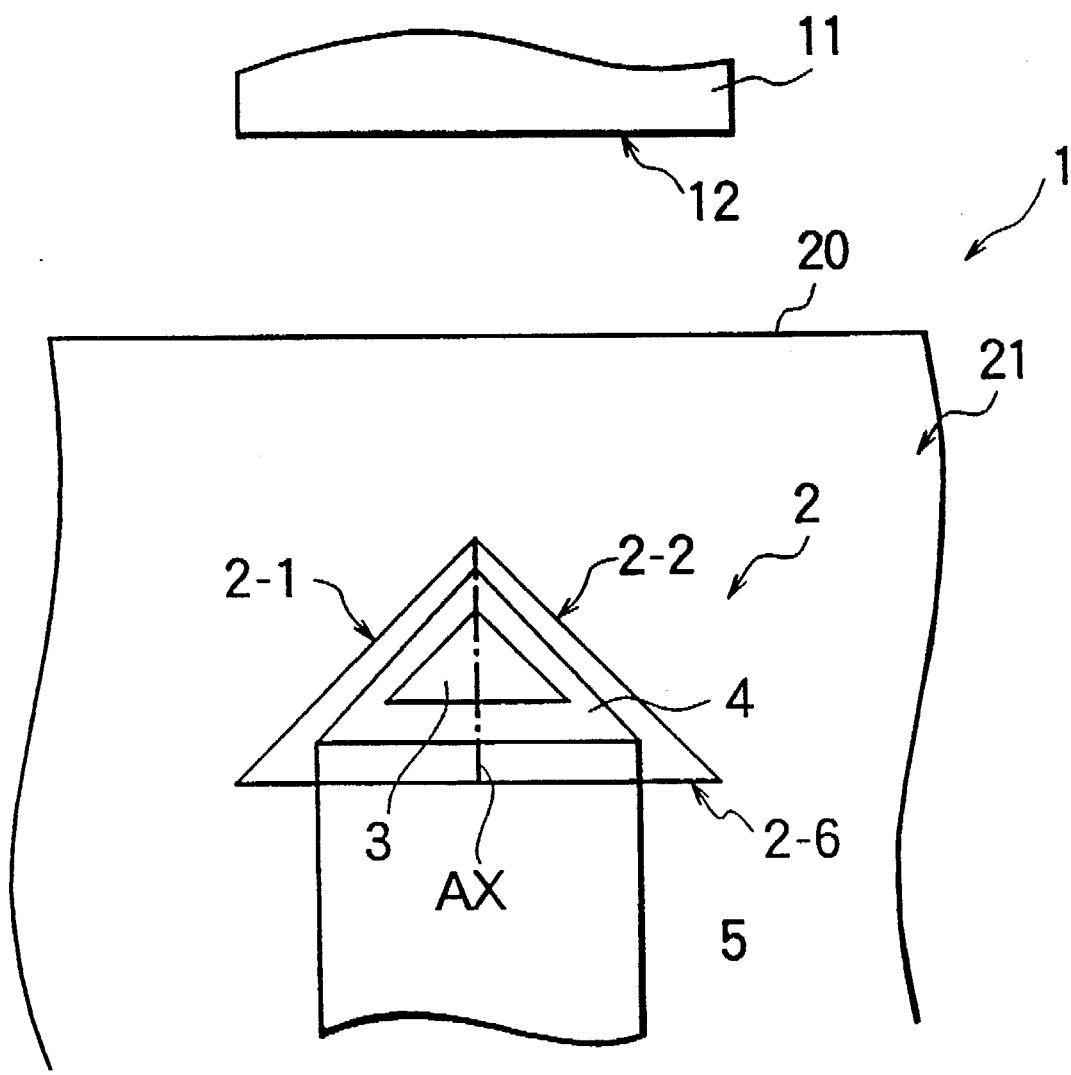
Figure 12A:
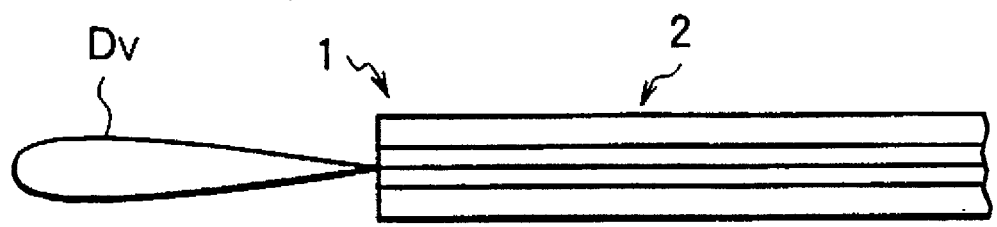
Figure 12B:
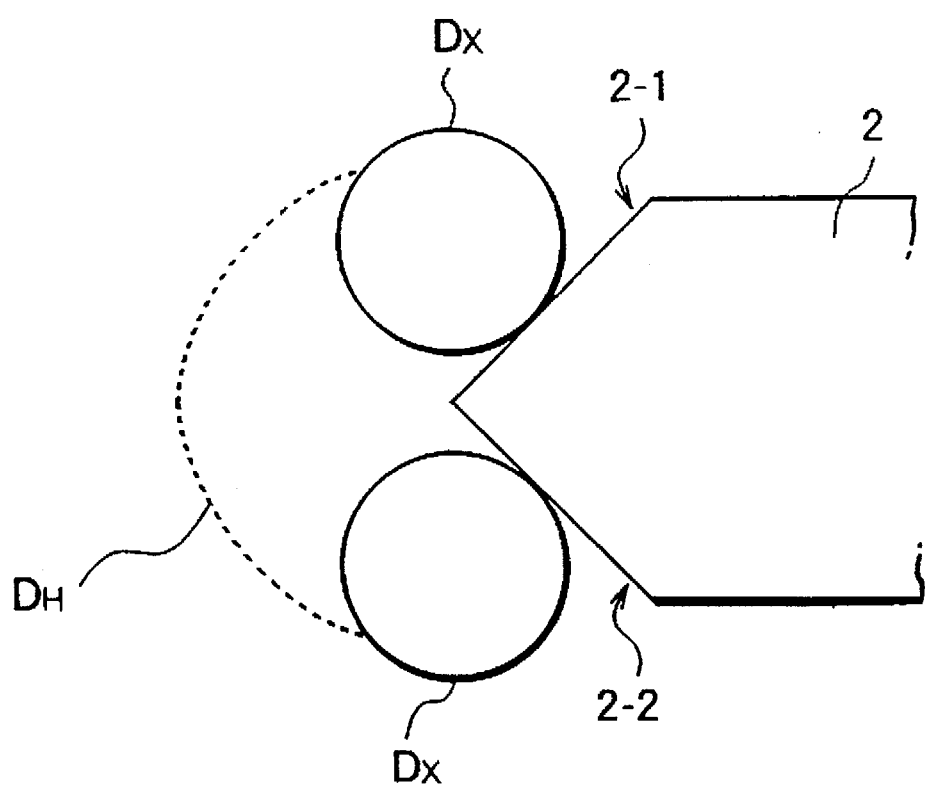
Figure 13:
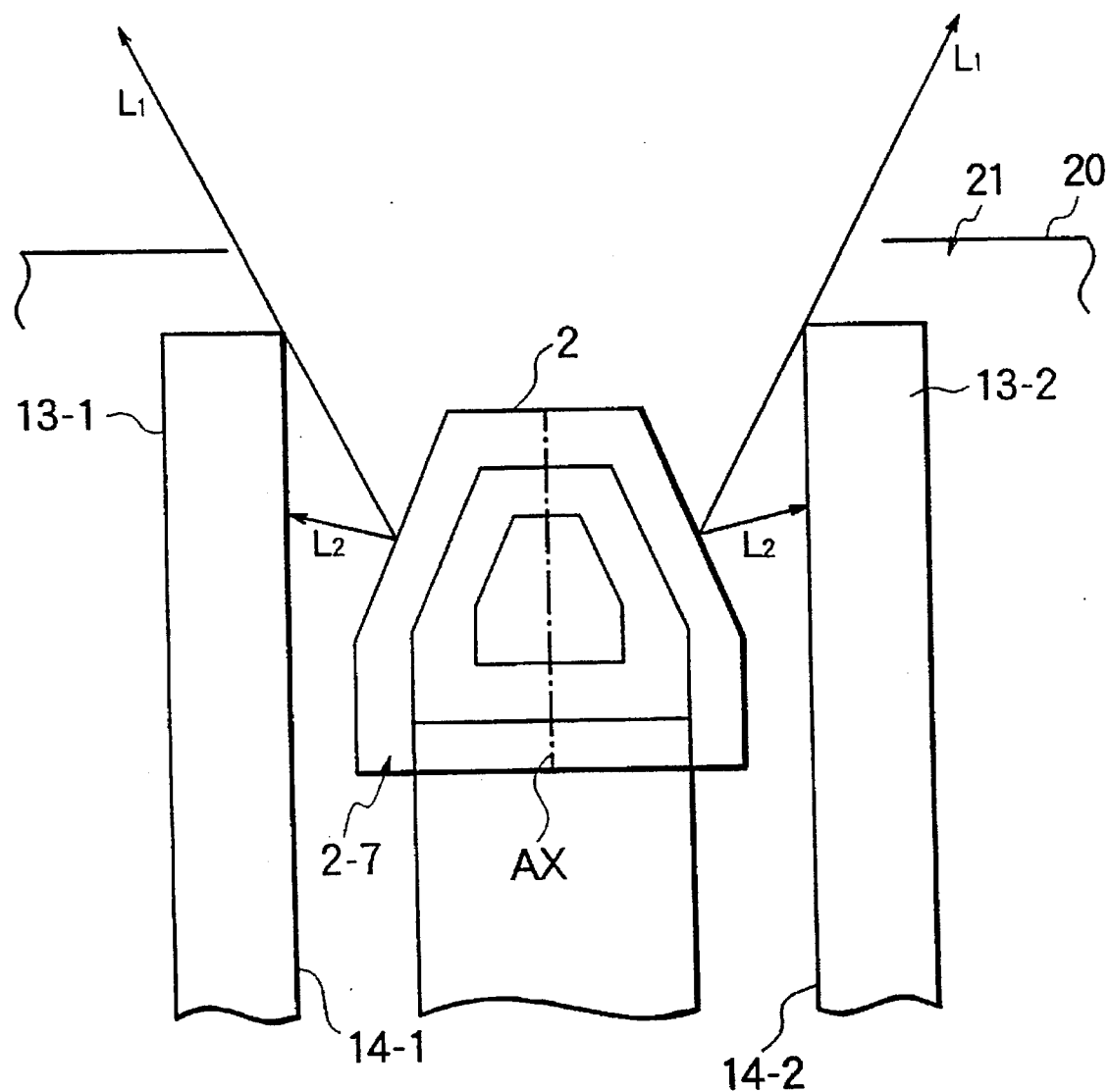
Figure 14:
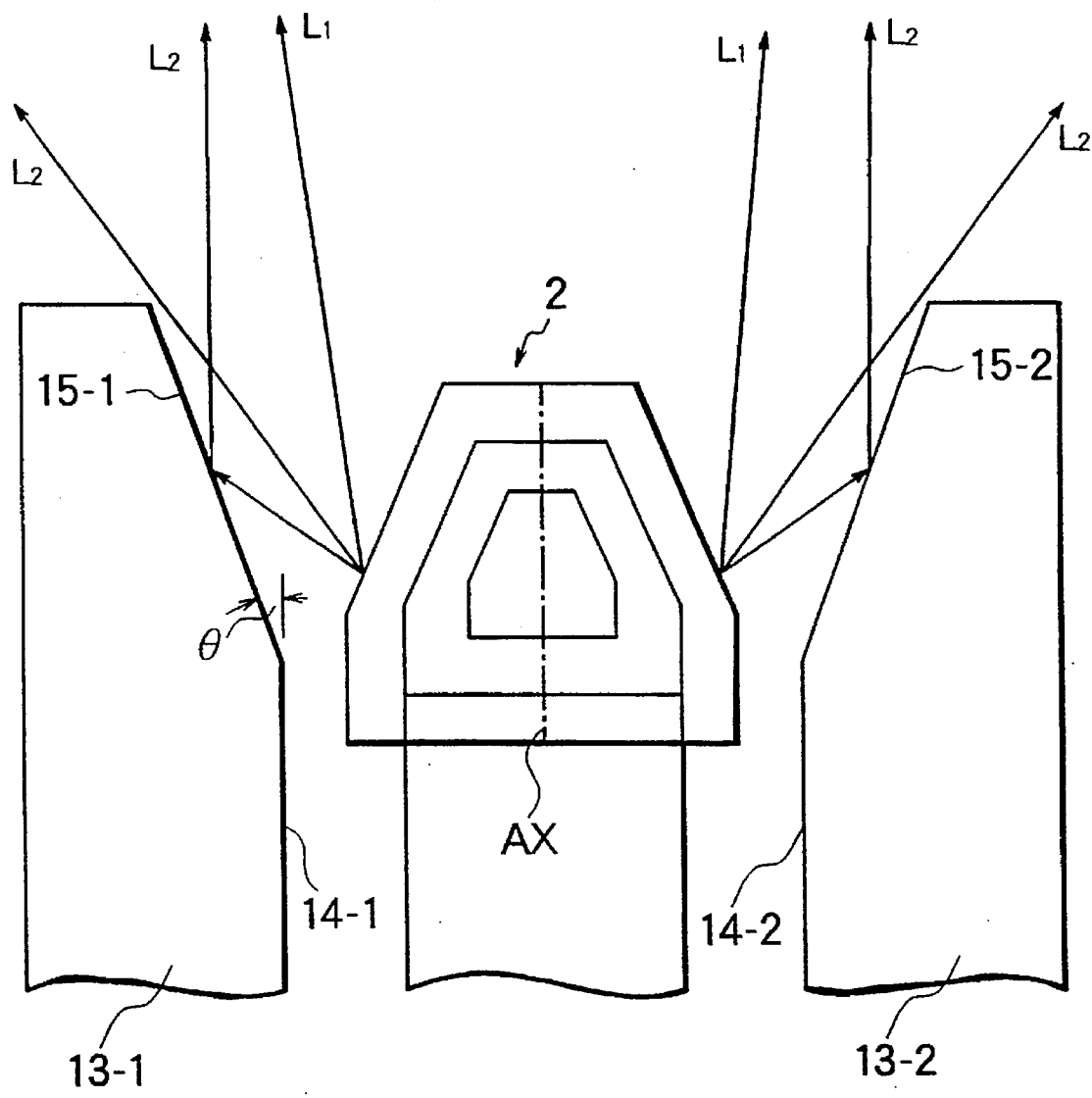
Figure 15:
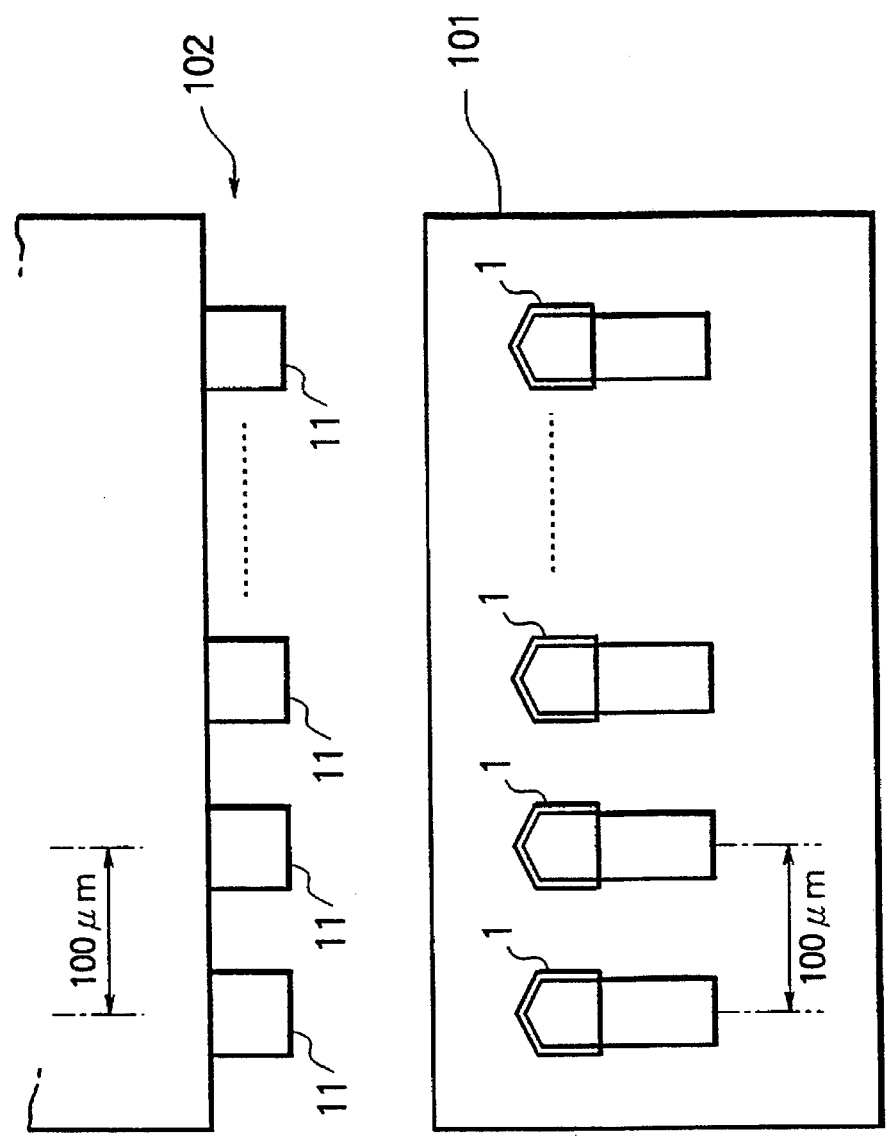
Figure 16:
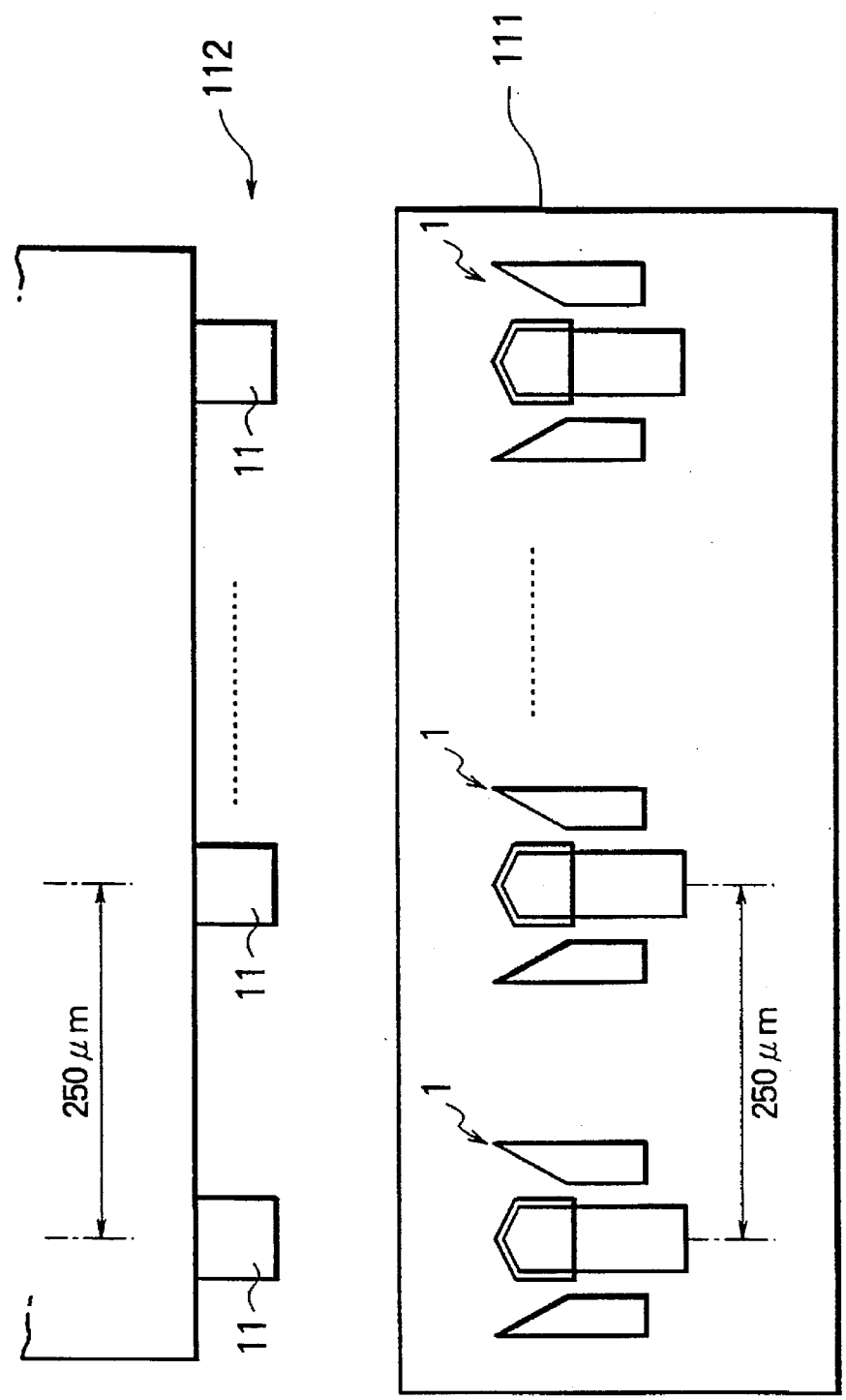
Figure 17A:
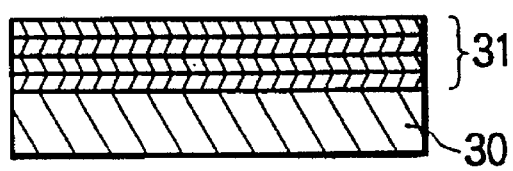
Figure 17D:
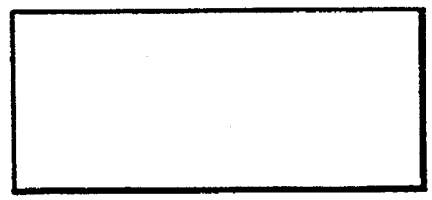
Figure 17B:
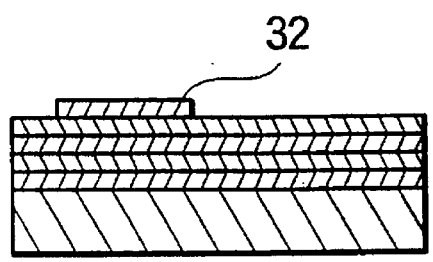
Figure 17E:
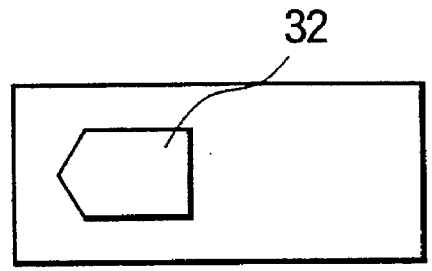
Figure 17C:
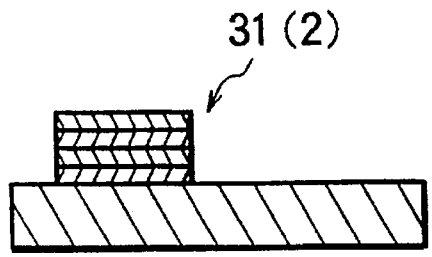
Figure 17F:
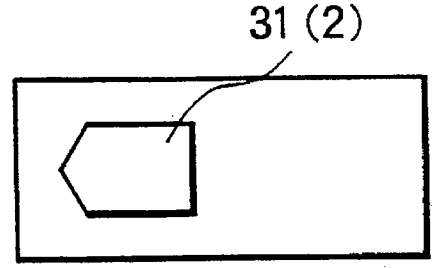
Figure 18A:
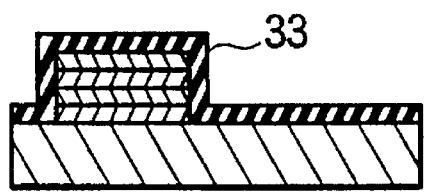
Figure 18B:
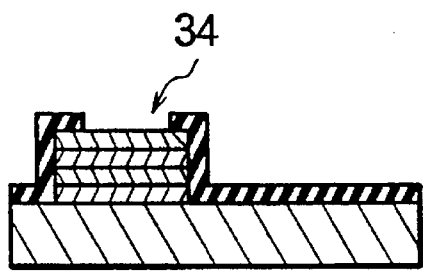
Figure 18C:
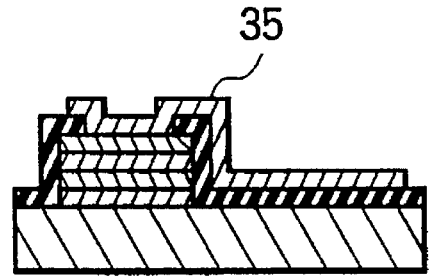
Figure 18D:
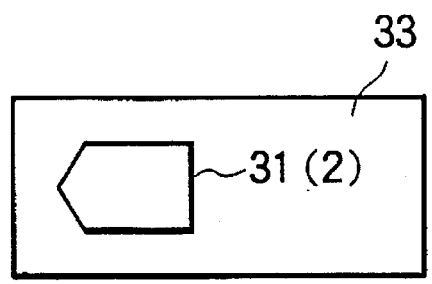
Figure 18E:
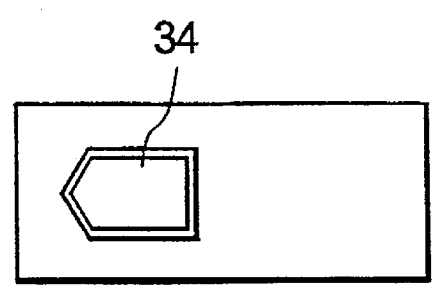
Figure 18F:
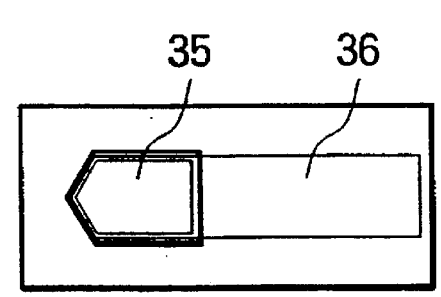
Figure 19A:
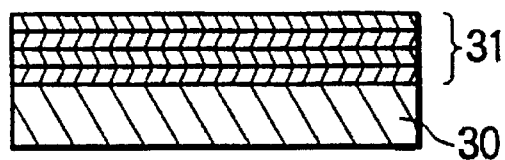
Figure 19D:
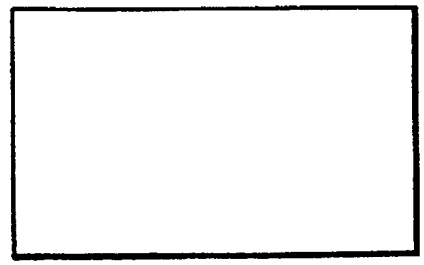
Figure 19B:
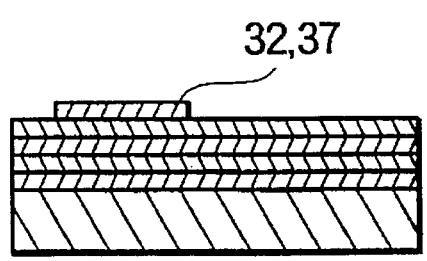
Figure 19E:
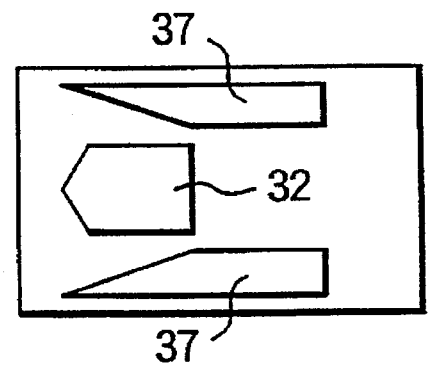
Figure 19C:
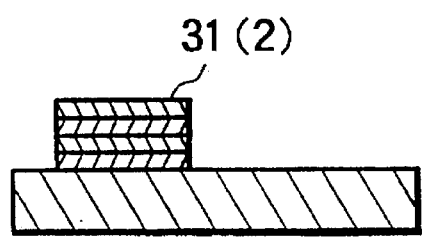
Figure 19F:
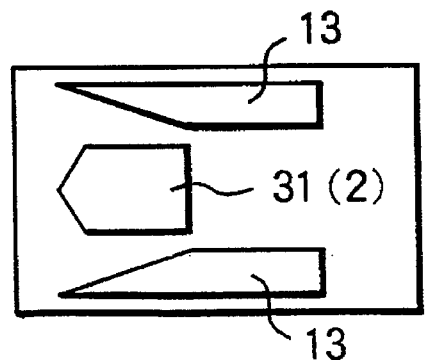
Figure 20A:
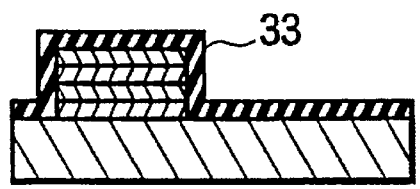
Figure 20B:
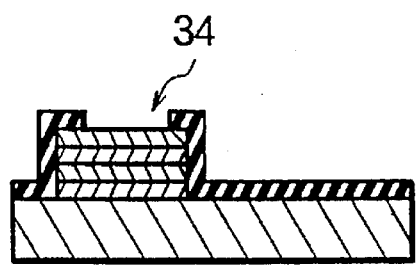
Figure 20C:
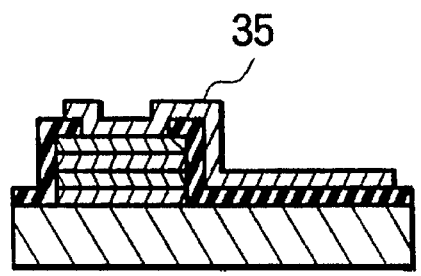
Figure 20D:
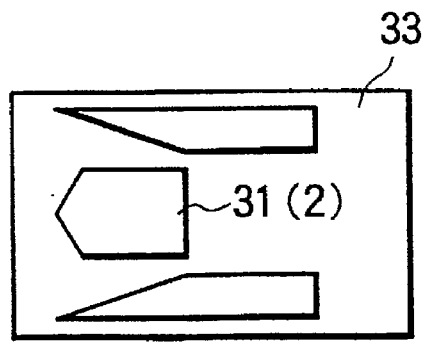
Figure 20E:
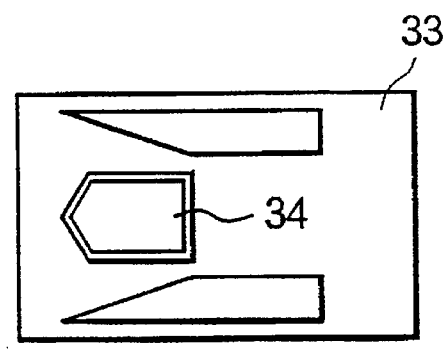
Figure 20F:
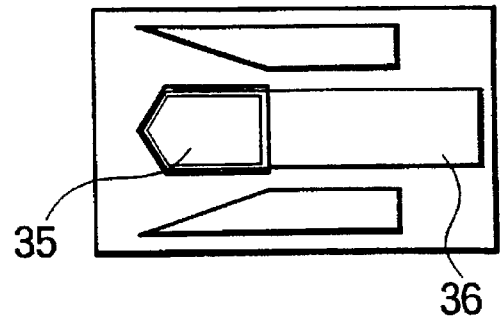

each of FIGS. 3a and 3b is a view showing a general light emitting element;

each of FIGS. 4a and 4b is a view showing a general light emitting element;

FIG. 5 is a perspective view schematically showing a light emitting element in accordance with a first embodiment of the present invention;

FIG. 6 is a plan view schematically showing the light emitting element in the first embodiment of the present invention;

FIG. 7 is a view showing one example of semiconductor layers;

FIG. 8 is a view showing a constructional example of the light emitting element of a general type;

FIG. 9 is a plan view schematically showing a light emitting element in accordance with a second embodiment of the present invention;

FIG. 10 is a graph showing measured results of a radiation distribution of light emitted from the light emitting element in the second embodiment;

FIG. 11 is a plan view schematically showing a light emitting element in accordance with a third embodiment of the present invention;

each of FIGS. 12a and 12b is a view showing distribution characteristics of a light output of a light emitting element having a double hetero structure;

FIG. 13 is a plan view schematically showing a light emitting element in accordance with a fourth embodiment of the present invention;

FIG. 14 is a view showing a modified example of the light emitting element shown in FIG. 13;

FIG. 15 is a view showing the schematic construction of an array-shaped light source in accordance with one embodiment of the present invention;

FIG. 16 is a view showing the schematic construction of an array-shaped light source in accordance with one embodiment of the present invention;

each of FIGS. 17a to 17c is a cross-sectional view showing an example of a manufacturing process of each of the light emitting element shown in FIG. 9 and the array-shaped light source shown in FIG. 15;

FIGS. 17d to 17f respectively correspond to FIGS. 17a to 17c and are plan views each showing the example of the manufacturing process shown in each of FIGS. 17a to 17c;

each of FIGS. 18a to 18c is a cross-sectional view showing an example of a manufacturing process of each of the light emitting element shown in FIG. 9 and the array-shaped light source shown in FIG. 15;

FIGS. 18d to 18f respectively correspond to FIGS. 18a to 18c and are plan views each showing the example of the manufacturing process shown in each of FIGS. 18a to 18c;

each of FIGS. 19a to 19c is a cross-sectional view showing an example of a manufacturing process of each of the light emitting element shown in FIG. 14 and the array-shaped light source shown in FIG. 16;

FIGS. 19d to 19f respectively correspond to FIGS. 19a to 19c and are plan views each showing the example of the manufacturing process shown in each of FIGS. 19a to 19c;

each of FIGS. 20a to 20c is a cross-sectional view showing an example of a manufacturing process of each of the light emitting element shown in FIG. 14 and the array-shaped light source shown in FIG. 16;

FIGS. 20d to 20f respectively correspond to FIGS. 20a to 20c and are plan views each showing the example of the manufacturing process shown in each of FIGS. 20a to 20c;

FIG. 21 is a view showing an example of the construction of an optical signal transmitter in accordance with the present invention; and FIG. 22 is a cross-sectional view of the optical signal transmitter shown in FIG. 21.

DESCRIPTION OF THE PREFERRED EMBODIMENTS

The preferred embodiments of a light emitting element, an array-shaped light source and a manufacturing method thereof, and an optical signal transmitter in the present invention will next be described in detail with reference to the accompanying drawings.

FIG. 5 is a perspective view schematically showing a light emitting element in accordance with a first embodiment of the present invention. FIG. 6 is a plan view schematically showing the light emitting element in the first embodiment of the present invention.

In a light emitting element 1 in the first embodiment shown in FIGS. 5 and 6, plural semiconductor layers 2 are formed on one principal surface 21 of a semiconductor substrate 20. At least one portion of the plural semiconductor layers 2 functions as a light emitting layer. FIG. 7 shows one example of the semiconductor layers 2. In the example of FIG. 7, the semiconductor layers 2 are constructed by a light emitting layer 7 and two semiconductor layers 8 and 9 supporting the light emitting layer 7 therebetween. Eg1 is set to band gap energy of the light emitting layer 7. Eg2 and Eg3 are respectively set to band gap energies of the semiconductor layers 8 and 9 supporting the light emitting layer 7 therebetween. In this case, Eg2>Eg1 and Eg3>Eg1 are formed. The semiconductor layers 8 and 9 constitute a so-called double hetero layer structure in which the semiconductor layers 8 and 9 are respectively of first and second conductivity types.

In this first embodiment, six end faces 2-1, 2-2, 2-3, 2-4, 2-5 and 2-6 in the semiconductor layers 2 are formed as planes perpendicular to one principal surface 21 of the semiconductor substrate 20 to improve coupling efficiency of an optical fiber 11 onto a light incident side end face 12 and prevent light emitting efficiency of the light emitting element 1 from being reduced. Namely, these six end faces are formed as planes perpendicular to a surface 2-7 of the semiconductor layers 2. Five end faces 2-1 to 2-5 among these six end faces 2-1 to 2-6 function as light emitting end faces. Namely, the light emitting element in the first embodiment functions as a light emitting diode of an edge emitting type having five light emitting end faces.

A planar shape of the light emitting layer surrounded by the end faces 2-1 to 2-6 is formed with line symmetry with respect to a symmetrical axis AX such that all angles formed between adjacent end faces are set to be smaller than 180°. Concretely, in the examples of FIGS. 5 and 6, an angle formed between the light emitting end faces 2-2 and 2-3 and an angle formed between the light emitting end faces 2-3 and 2-4 are respectively set to 35°.

An entire face of the semiconductor layers 2 is covered with an unillustrated transparent insulating film. A contact hole portion 3 is formed in one portion of the semiconductor layers 2. An ohmic electrode 4 is formed by a metallic material in the contact hole portion 3 such that the ohmic electrode 4 comes in contact with the semiconductor layers 2. An unillustrated bonding pad is arranged after the semiconductor layers 2. Metallic wiring 5 is formed to electrically connect the bonding pad to the ohmic electrode 4.

In such a construction, lights emitted from light emitting facets 2-2, 2-3 and 2-4 are synthesized among lights emitted from light emitting facets 2-1, 2-2, 2-3, 2-4 and 2-5 of the light emitting element 1. A synthetic component of these lights can be incident upon the end face 12 of the optical fiber 11 positioned in front of the light emitting element 1.

A light emitting diode 2001 of an edge emitting type as a general type as shown in FIG. 8 is prepared for comparison to research characteristics of the light emitting element (the light emitting diode of an edge emitting type) 1 in the first embodiment. The light emitting diode 2001 of an edge emitting type shown in FIG. 8 has a semiconductor layer structure and an element volume equal to those of the light emitting element (light emitting diode) 1 in the first embodiment, and has a square element shape as a semiconductor layer shape. Namely, in the light emitting diode 2001 shown in FIG. 8, a semiconductor layer 2002 has four end faces 2002-1 to 2002-3 and 2002-6. The three end faces 2002-1 to 2002-3 function as light emitting end faces.

Light is incident to the optical fiber 11 by using the light emitting diode 1 in the first embodiment. An amount of light in an optical fiber end portion (a light emitting side end portion) on a side opposed to the light incident side end portion 12 of the optical fiber 11 is increased about 1.2 times in comparison with a case in which light is emitted from the light emitting diode shown in FIG. 8 by using the same injected electric current as the light emitting diode 1 in the first embodiment.

When light is emitted from each of the light emitting diode 1 in the first embodiment and the light emitting diode shown in FIG. 8 by the same driving electric current, electric current injecting densities of these light emitting diodes are approximately equal to each other and aging characteristics of these light emitting diodes are approximately equal to each other.

Accordingly, coupling efficiency of the light emitting element and the optical fiber can be improved and a reduction in light emitting efficiency of the light emitting element can be prevented by using the light emitting element (light emitting diode) 1 in the first embodiment without reducing element characteristics, etc.

FIG. 9 is a plan view schematically showing a light emitting element in accordance with a second embodiment of the present invention. In a light emitting element 1 in this second embodiment shown in FIG. 9, five facets 2-1, 2-2, 2-3, 2-4 and 2-6 in semiconductor layers 2 are formed as planes perpendicular to one principal surface 21 of a semiconductor substrate 20 to improve coupling efficiency of an optical fiber 11 onto an end face 12 of the optical fiber and prevent a reduction in light emitting efficiency of the light emitting element 1. Namely, these five facets are formed as planes perpendicular to a surface 2-7 of the semiconductor layers 2. Four facets 2-1 to 2-4 among these five facets function as light emitting facets. Namely, the light emitting element in the second embodiment functions as a light emitting diode of an edge emitting type having four light emitting end faces.

A planar shape of a light emitting layer surrounded by the end faces 2-1 to 2-4 and 2-6 is formed with line symmetry with respect to a symmetrical axis AX such that all angles formed between adjacent end faces are set to be smaller than 180°. Concretely, in the example shown in FIG. 9, an angle formed between end faces 2-6 and 2-1 and an angle formed between end faces 2-6 and 2-4 are respectively set to 90°. Further, an angle formed between end faces 2-2 and 2-3 is set to range from 80° to 100°. More concretely, the angle formed between light emitting end faces 2-2 and 2-3 is set to 90°. End faces 2-6, 2-1 and 2-4 have the same width and end faces 2-2 and 2-3 have the same width.

An entire face of the semiconductor layers 2 is covered with an unillustrated transparent insulating film. A contact hole portion 3 is formed in one portion of the semiconductor layers 2. An ohmic electrode 4 is formed by a metallic material in the contact hole portion 3 such that the ohmic electrode 4 comes in contact with the semiconductor layers 2. An unillustrated bonding pad is arranged after the semiconductor layers 2. Metallic wiring 5 is formed to electrically connect the bonding pad to the ohmic electrode 4.

In such a construction, lights emitted from light emitting facets 2-2 and 2-3 are synthesized among lights emitted from light emitting facets 2-1, 2-2, 2-3 and 2-4 of the light emitting element 1. A synthetic component of these lights can be incident upon the end face 12 of the optical fiber 11 positioned in front of the light emitting element 1. In this case, a spot shape of light can be reduced in size by synthetically combining the lights emitted from the light emitting facets 2-2 and 2-3 with each other.

In the light emitting element in this second embodiment, an electrode forming portion can have a relatively wide area in a portion approximately separated from the light emitting facets 2-2 and 2-3 even when the light emitting element has a compact structure. Namely, an area sufficient to form an electrode of the light emitting element can be secured. Accordingly, stable ohmic characteristics of the light emitting element can be secured.

Further, the angle formed between the two light emitting end faces 2-2 and 2-3 ranges from 80° to 100° so that coupling efficiency of the light emitting element and the optical fiber can be improved. In particular, when a maximum diameter of a beam spot from the light emitting element is approximately equal to the diameter of a light receiving face of the optical fiber, the angle formed between the light emitting end faces 2-2 and 2-3 is desirably set to 90° when the coupling efficiency of the light emitting element and the optical fiber is increased without increasing the maximum diameter of the beam spot of the light emitting element.

A light emitting diode of an edge emitting type as a general type having a shape similar to that shown in FIG. 8 is prepared for comparison to research characteristics of the light emitting element (the light emitting diode of an end face light emitting type) 1 in the second embodiment. Namely, the light emitting diode of an edge emitting type as a general type used for comparison has a semiconductor layer structure and an element volume equal to those of the light emitting diode in the second embodiment, and has a square element shape as a semiconductor layer shape.

FIG. 10 shows measured results of a radiation distribution of light emitted from each of the light emitting diode 1 in the second embodiment and the light emitting diode of a general type. In FIG. 10, the same injected electric current flows through each of the light emitting diode 1 in the second embodiment and the light emitting diode of a general type.

It should be understood from FIG. 10 that the light emitting diode in the second embodiment has a higher light amount in an entire region of measured angles in comparison with the light emitting diode of a general type. Further, in FIG. 10, an angle required to receive light of the optical fiber is equal to an angular portion within ±20°. An increase in light amount provided by this angular portion contributes to an increase in coupling efficiency of the light emitting element and the optical fiber. Accordingly, when the angular portion within ±20° in FIG. 10 is noticed, the coupling efficiency of the light emitting diode in the second embodiment and the optical fiber is increased about 1.2 times in comparison with the light emitting diode of a general type. Thus, the light emitting element in the second embodiment can have a compact structure and high coupling efficiency with respect to the optical fiber. Further, a reduction in light emitting efficiency of the light emitting element can be prevented.

FIG. 11 is a plan view showing a light emitting element in accordance with a third embodiment of the present invention. In a light emitting element 1 in this third embodiment shown in FIG. 11, three end faces 2-1, 2-2 and 2-6 in semiconductor layers 2 are formed as planes perpendicular to one principal surface 21 of a semiconductor substrate 20 to improve coupling efficiency of an optical fiber 11 onto a light incident side end face 12 and prevent light emitting efficiency of the light emitting element 1 from being reduced. Namely, these three end faces are formed as planes perpendicular to a surface 2-7 of the semiconductor layers 2. Two end faces 2-1 and 2-2 among these three end faces are set to light emitting end faces. Namely, the light emitting element in the third embodiment functions as a light emitting diode of an edge emitting type having two light emitting end faces.

A planar shape of a light emitting layer surrounded by the end faces 2-1, 2-2 and 2-6 is formed with line symmetry with respect to a symmetrical axis AX such that all angles formed between adjacent end faces are set to be smaller than 180°. Concretely, in the example of FIG. 11, an angle formed between end faces 2-1 and 2-2 is set to range from 80° to 100°. More concretely, the angle formed between light emitting end faces 2-1 and 2-2 is set to 90°. End faces 2-1 and 2-2 have the same width.

An entire face of the semiconductor layers 2 is covered with an unillustrated transparent insulating film. A contact hole portion 3 is formed in one portion of the semiconductor layers 2. An ohmic electrode 4 is formed by a metallic material in the contact hole portion 3 such that the ohmic electrode 4 comes in contact with the semiconductor layers 2. An unillustrated bonding pad is arranged after the semiconductor layers 2. Metallic wiring 5 is formed to electrically connect the bonding pad to the ohmic electrode 4.

In such a construction, a synthetic component of lights emitted from the light emitting end faces 2-1 and 2-2 of the light emitting element 1 can be incident to the light incident side end face 12 of the optical fiber 11 arranged in front of the light emitting element 1. In this case, the angle formed between the two light emitting end faces 2-1 and 2-2 ranges from 80° to 100° so that coupling efficiency of the light emitting element and the optical fiber can be improved. In particular, when a maximum diameter of a beam spot from the light emitting element is approximately equal to the diameter of a light receiving face of the optical fiber, the angle formed between the light emitting end faces 2-1 and 2-2 is desirably set to 90° when the coupling efficiency of the light emitting element and the optical fiber is increased without increasing the maximum diameter of the beam spot of the light emitting element.

Further, in this light emitting element in the third embodiment, areas of the light emitting end faces 2-1 and 2-2 can be increased with respect to an element volume. Namely, the element volume can be relatively reduced with respect to the areas of the light emitting end faces 2-1 and 2-2. Accordingly, a light output of the light emitting element with respect to an injected electric current can be increased so that higher light emitting efficiency can be obtained.

When light is really incident to the optical fiber 11 by using the light emitting element (the light emitting diode of an end face light emitting type) 1 in this third embodiment, an amount of light provided in an end portion (a light emitting side end portion) of the optical fiber on a side opposed to the light incident side end portion 12 of the optical fiber 11 is increased about 2 times in comparison with a case in which light is emitted from a square light emitting diode of an edge emitting type having a light emitting layer structure and a volume equal to those of the light emitting diode 1 in the third embodiment by using the same electric current. This square light emitting diode is a light emitting diode of the edge emitting type as a general type having a structure and a shape similar to those shown in FIG. 8.

When light is emitted from each of the light emitting diode 1 in this third embodiment and the square light emitting diode of an edge emitting type as a general type by the same driving electric current, electric current injecting densities of these light emitting diodes are approximately equal to each other and life characteristics of these light emitting diodes are approximately equal to each other.

Accordingly, coupling efficiency of the light emitting diode and the optical fiber can be improved and higher light emitting efficiency of the light emitting element can be obtained by using the light emitting element 1 in the third embodiment without reducing element characteristics, etc.

As mentioned above, the light emitting element in each of the first to third embodiments comprises plural semiconductor layers including a light emitting layer formed on one principal surface of a semiconductor substrate and constructed such that at least one portion of end faces of the plural semiconductor layers including the light emitting layer is set to a light emitting end face. Plural light emitting end faces are formed in the light emitting element. Angles formed between mutual adjacent end faces of the respective light emitting end faces are set such that lights emitted from at least two light emitting end faces among the plural light emitting end faces are mutually synthesized. Therefore, a synthetic component of light emitted from the light emitting element forms a large intensity distribution approximately on a front face of the light emitting element, i.e., in the vicinity of a light receiving face 12 of an optical fiber. Accordingly, a light output of the light emitting element is increased approximately on the front face of the light emitting element. Hence, an amount of light coupled to the optical fiber is increased so that coupling efficiency of the light emitting element and the optical fiber can be increased. Further, no lens for external attachment, etc. are required so that the above effects of the present invention can be obtained without using any lens for external attachment, etc. Therefore, the light emitting element has a compacter structure and manufacturing cost of the light emitting element, etc. can be further reduced as the light emitting diode of an edge emitting type coupled to the optical fiber.

The next explanation relates to a semiconductor layer of a double hetero structure as shown in FIG. 7 which is used as the semiconductor layers 2 in the light emitting element in each of the first to third embodiments.

Epitaxial growth using MO-VPE is used to grow a crystal Of each of such semiconductor layers 2. Namely, an n-GaAs wafer is used as a semiconductor substrate 20. The semiconductor layers 2 are made by sequentially growing a buffer layer of n-GaAs (carrier concentration: $3 \times 10^{18}$ thickness: 4000 Å), a clad layer of n-Al$_{0.4}$Ga$_{0.6}$As (carrier concentration: $2 \times 10^{17}$, thickness: 11500 Å), an active layer of nondope-GaAs (thickness: 500 Å), a clad layer of p-Al$_{0.4}$Ga$_{0.6}$As (carrier concentration: $5 \times 10^{17}$ thickness: 11500 Å), and a cap layer of p-GaAs (carrier concentration: $1 \times 10^{20}$, thickness: 2000 Å) on the semiconductor substrate 20. The clad layer of n-Al$_{0.4}$Ga$_{0.6}$As corresponds to the semiconductor layer 8. The active layer corresponds to the light emitting layer 7. The clad layer of p-Al$_{0.4}$Ga$_{0.6}$As corresponds to the semiconductor layer 9.

Each of FIGS. 12a and 12b shows far field pattern of a light output of the light emitting element (light emitting diode) 1 using the semiconductor layers 2 made as above. FIG. 12a shows vertical far field pattern D$_V$ of the light emitting element 1. FIG. 12b shows horizontal far field pattern D$_H$ of the light emitting element 1. It should be understood from FIG. 12a that a narrow far field pattern in a vertical direction can be obtained by confinement effects of light using the double hetero structure. A distribution angle is equal to about 10° in full angle at half maximum. From FIG. 12b, there are no confinement effects of light in a horizontal direction in the light emitting element of the double hetero structure. Accordingly, far field pattern D$_X$ of light emitted from each of light emitting facets approximately show a perfect diffusive distribution. For example, these light emitting facets are set to faces 2-1 and 2-2 in the example of FIG. 11. Accordingly, far field pattern D$_H$ of synthetic light of lights emitted from the respective light emitting facets show a strong peak intensity near a tangential line of each of the light emitting facets as shown in FIG. 12b.

Accordingly, it is confirmed that it is effective to use crystal growth layers of the double hetero structure as shown in FIG. 7 as the semiconductor layers 2 of the light emitting element 1 in the present invention when coupling efficiency of the light emitting element and an optical fiber is increased by synthesis of lights emitted from the respective light emitting facets.

Namely, a vertical far field pattern of light emitted from the light emitting element 1 can be narrowed by the confinement effects of light using the double hetero structure. In contrast to this, a horizontal far field pattern of this light can be set to be close to a perfect diffusive distribution. Therefore, this double hetero structure is suitable for an object of the present invention in which a light amount of the light emitting element is increased by synthesis of lights emitted from the plural light emitting facets. Accordingly, high coupling efficiency of the light emitting element and the optical fiber can be obtained by setting the semiconductor layers 2 to the double hetero structure.

In the above example, the n-GaAs wafer is used as the semiconductor substrate 20. However, a p-GaAs wafer may be used as the semiconductor substrate 20. Effects similar to the above-mentioned effects can be also obtained when the p-GaAs wafer is used as the semiconductor substrate 20. Namely, for example, semiconductor layers are made by sequentially growing a buffer layer of p-GaAs (carrier concentration: $5 \times 10^{18}$, thickness: 4000 Å), a clad layer of p-Al$_{0.4}$Ga$_{0.6}$As (carrier concentration: $5 \times 10^{17}$, thickness: 11500 Å), an active layer of GaAs (thickness: 500 Å) having no doped impurities, a clad layer of n-Al$_{0.4}$Ga$_{0.6}$As (carrier concentration: $2 \times 10^{17}$, thickness: 11500 Å), and a cap layer of n-GaAs (carrier concentration: $3 \times 10^{18}$ thickness: 2000 Å) on the p-GaAs wafer as the semiconductor substrate 20. The clad layer of p-Al$_{0.4}$Ga$_{0.6}$As corresponds to the semiconductor layer 8. The active layer corresponds to the light emitting layer 7. The clad layer of n-Al$_{0.4}$Ga$_{0.6}$As corresponds to the semiconductor layer 9. Effects similar to the above effects can be also obtained by using such semiconductor layers.

In the above example, the double hetero structure of GaAs-AlGaAs is used. However, a double hetero structure using another multi-dimensional compound semiconductor such as InP-InGaAsP, etc. may be used. In this case, effects similar to the above effects can be also obtained by using such a double hetero structure.

FIG. 13 is a view showing the construction of a light emitting element in accordance with a fourth embodiment of the present invention. In the example of FIG. 13, each of semiconductor layers 2 uses a shape as shown in each of FIGS. 5 and 6.

In FIG. 13, the light emitting element in the fourth embodiment has structures 13-1 and 13-2 for light interruption on both sides of the semiconductor layers 2. For example, these light interrupting structures 13-1 and 13-2 are formed on one principal surface 21 of the semiconductor substrate 20. Faces 14-1 and 14-2 of the light interrupting structures 13-1 and 13-2 opposed to the semiconductor layers 2 function as planes for light interruption. The faces 14-1 and 14-2 of the light interrupting structures 13-1 and 13-2, i.e., the light interrupting planes are approximately perpendicular to a surface 2-7 of the semiconductor layers 2 and have heights equal to or higher than the heights of light emitting end faces of the semiconductor layers 2. Further, the light interrupting planes have widths equal to or longer than at least a length of the semiconductor layers 2 along a line symmetrical axis AX thereof. The light interrupting planes are positioned in positions in which the light interrupting planes are parallel to the symmetrical axis AX of the semiconductor layers 2 and do not come in contact with the semiconductor layers 2 and are located with line symmetry with respect to the symmetrical axis AX.

In the light emitting element shown in FIG. 13, light $L_1$ in a forward direction of the light emitting element among lights emitted from light emitting end faces 2-1, 2-2, 2-3, 2-4 and 2-5 of the semiconductor layers 2 is emitted forward without interruption of the light interrupting planes 14-1 and 14-2. However, light $L_2$ emitted in a side direction of the light emitting element is mainly interrupted on the light interrupting planes 14-1 and 14-2. Thus, light emitted in the side direction of the light emitting element can be restrained in the light emitting element in the fourth embodiment so that stray light except for light originally incident to an optical fiber 11 can be reduced.

Namely, with respect to the lights emitted from the light emitting end faces 2-1, 2-2, 2-3, 2-4 and 2-5, the light $L_2$ emitted in the side direction of the light emitting element and causing noises such as stray light, etc. is interrupted on the light interrupting planes 14-1 and 14-2 of the light interrupting structures 13-1 and 13-2. Accordingly, only the light $L_1$ emitted in the forward direction of the light emitting element can be selectively emitted from the light emitting element 1. Thus, an optical signal can be reliably transmitted by using such a light emitting element.

In reality, optical signals are transmitted in parallel by using two light emitting elements in the fourth embodiment and two optical fibers. As a result, noises caused by stray light are reduced and crosstalk of light between the two optical fibers can be reduced to about ⅕ in comparison with a case in which no light interrupting structures are formed.

FIG. 14 is a view showing a modified example of the light emitting element shown in FIG. 13. In the light emitting element of FIG. 13, the entire light interrupting faces 14-1 and 14-2 of the light interrupting structures 13-1 and 13-2 opposed to the semiconductor layers are formed in parallel with the symmetrical axis AX. However, in the light emitting element of FIG. 14, partial faces 15-1 and 15-2 of light interrupting planes 14-1 and 14-2 are inclined by an angle θ between 20° and 45° with respect to the line symmetrical axis AX.

In the light emitting element shown in FIG. 14, light $L_1$ in a forward direction of the light emitting element among lights emitted from light emitting end faces 2-1, 2-2, 2-3, 2-4 and 2-5 of the semiconductor layers 2 is emitted forward without interruption of the light interrupting planes 14-1 and 14-2. Light $L_2$ emitted in a side direction of the light emitting element is mainly interrupted on the light interrupting planes 14-1 and 14-2. However, the partial planes 15-1 and 15-2 (planes for light reflection) of the light interrupting planes 14-1 and 14-2 are not parallel to the symmetrical axis AX, but are inclined by the angle θ from 20° to 45° with respect to the symmetrical axis AX. Accordingly, a portion of the light $L_2$ is emitted forward without interruption of these planes 15-1 and 15-2, or is reflected forward on these planes 15-1 and 15-2.

Thus, in the light emitting element of FIG. 14, a portion of light emitted in the side direction of the light emitting element can be deflected in the forward direction of the light emitting element. As a result, a portion of light emitted in the side direction of the light emitting element and originally not incident to an optical fiber can be deflected in the forward direction of the light emitting element and can be incident to the optical fiber. Accordingly, coupling efficiency of the light emitting element and the optical fiber can be further improved.

Namely, with respect to lights emitted from light emitting end faces, light emitted onto a side of the light emitting element is reflected on a light reflecting plane of a structure for reflection and is emitted in the forward direction of the light emitting element. This light can be emitted from the light emitting element together with lights directly emitted from the light emitting end faces in the forward direction of the light emitting element. Accordingly, light emitted from the light emitting element can be more effectively emitted in the forward direction of the light emitting element so that high coupling efficiency of the light emitting element and the optical fiber can be obtained. An angle formed between the symmetrical axis AX of the light emitting element 1 and the light reflecting plane is desirably set to range from 20° to 45° so as to effectively deflect light emitted onto a side of the light emitting element in the forward direction of the light emitting element. In particular, the angle formed between the symmetrical axis AX of the light emitting element 1 and the light reflecting plane is desirably set to 22.5° so as to effectively utilize light emitted from each of the light emitting end faces 2-1 and 2-5 on sides of the light emitting element.

In reality, when the light emitting element of FIG. 14 is used in a signal transmitter, the coupling efficiency of the light emitting element and the optical fiber can be increased about 1.4 times in comparison with a case in which no light emitting element has a structure for light interruption (reflection).

In the examples of FIGS. 13 and 14, each of the semiconductor layers 2 uses a shape shown in each of FIGS. 5 and 6, but can use a shape shown in each of FIGS. 9 and 11.

FIG. 15 is a view showing the schematic construction of an array-shaped light source in accordance with one embodiment of the present invention. The array-shaped light source 101 shown in FIG. 15 is constructed by aligning plural light emitting elements (light emitting diodes) 1 each mentioned above and formed in an array shape. Namely, this array-shaped light source 101 is formed by aligning the above plural light emitting elements 1 at least in one line on the same semiconductor substrate in a state in which light emitting directions of the respective light emitting elements 1 are set to the same direction.

In the example of FIG. 15, each of the light emitting diodes 1 uses a light emitting diode having a shape shown in the second embodiment illustrated in FIG. 9. For example, ten light emitting diodes 1 are aligned with each other at a pitch of 100 μm.

In the array-shaped light source 101 provided by aligning the plural light emitting diodes 1 in an array shape, the plural light emitting diodes 1 can be used by coupling these diodes to plural optical fibers 11. In this case, for example, an optical fiber array 102 is prepared by aligning ten optical fibers 11 in advance at a pitch of 100 μm. Thereafter, optical axes of light emitting diodes at both ends of the array-shaped light source 101 and optical fibers corresponding these light emitting diodes, etc. are adjusted. Thus, as shown in FIG. 15, all the ten optical fibers can be very easily coupled to the corresponding light emitting diodes. Namely, it is sufficient to adjust the optical axes of only two light emitting elements at both ends of the light source in a positioning process of the optical fibers and the light emitting elements. Accordingly, a time required to couple the ten light emitting elements to the optical fibers can be reduced to about ⅕ in comparison with the general case. Namely, the positioning process can be simplified. Further, the array-shaped light source shown in FIG. 15 uses the light emitting elements as mentioned above so that coupling efficiencies of the light emitting elements 1 and the optical fibers are high.

Accordingly, the coupling efficiencies of the light emitting elements and the optical fibers can be greatly increased.

FIG. 16 is a view showing a constructional example of the array-shaped light source using the light emitting element of FIG. 13 or 14 as each of the light emitting elements 1. In this constructional example, five light emitting diodes 1 are aligned with each other at a pitch of 250 μm.

Similar to the array-shaped light source shown in FIG. 15, plural light emitting diodes 1 in this array-shaped light source 111 can be coupled to plural optical fibers 11. Namely, in this case, for example, an optical fiber array 112 is prepared by aligning five optical fibers 11 in advance at a pitch of 250 μm. Thereafter, optical axes of light emitting diodes at both ends of the array-shaped light source and optical fibers corresponding to these light emitting diodes, etc. are adjusted. Thus, as shown in FIG. 16, all the five optical fibers can be very easily coupled to the corresponding light emitting diodes. Namely, it is sufficient to adjust the optical axes of only two light emitting elements at both ends of the light source in a positioning process of the optical fibers and the light emitting elements. Accordingly, a time required to couple the five light emitting elements to the optical fibers can be reduced to about ½ in comparison with the general case. Namely, the positioning process can be simplified. Further, the array-shaped light source shown in FIG. 16 uses the light emitting element of FIG. 13 or 14 as each of the light emitting elements 1 so that light emitted in a side direction of the light emitting element is restrained and crosstalk of light caused by stray light can be reduced to ⅕ or less in comparison with the general case. Namely, stray light causing noises is reduced by using such a structure for light interruption. Further, high coupling efficiency of a light emitting element and an optical fiber can be obtained. Furthermore, it is possible to reduce generation of an error in operation of the array-shaped light source caused by crosstalk of light at a parallel transmitting time.

FIGS. 17 and 18 are views schematically showing manufacturing processes of the light emitting element shown in FIG. 9 and the array-shaped light source shown in FIG. 15.

In a manufacturing process example shown in FIGS. 17a to 17f, a crystal growth layer 31 as a semiconductor layer including at least a double hetero structure is first formed on a semiconductor wafer 30 by MO-VPE as mentioned above as shown in FIG. 17a. Thereafter, an etching mask 32 having a shape of the semiconductor layer 2 is made by photolithography as shown in FIG. 17b. Next, the crystal growth layer 31 is processed in the shape of the etching mask 32 by dry etching using chlorine so that the crystal growth layer 31 is formed as the semiconductor layer 2 as shown in FIG. 17c. The etching mask 32 is removed after the semiconductor layer 2 is formed.

Thereafter, as shown in FIG. 18a, an insulating film 33 of SiO₂ is deposited on an entire light emitting element by PE-CVD such that this insulating film 33 has 2000 Å in thickness. Next, as shown in FIG. 18b, a contact hole 34 is formed in a predetermined portion of the semiconductor layer 2 by photolithography and wet etching. Thereafter, aluminum wiring 35 having 1 μm in thickness is formed. In this case, an ohmic electrode 35 is formed in the contact hole 34 and a bonding pad 36 is formed in a rear portion of the light emitting element as shown in FIGS. 18c and 18f. Thereafter, an electrode is formed on a rear face of the light emitting element so that the light emitting element is completely manufactured. In such processes, the light emitting element shown in FIG. 9 can be simply manufactured.

Namely, the light emitting element can be made by simple processes of epitaxial growth, formation of the semiconductor layer using dry etching, and electrode formation so that yield can be improved.

The array-shaped light source shown in FIG. 15 can be manufactured by using the above etching mask 32 such that semiconductor layers 2 of the light emitting element 1 are suitably aligned in an array shape. In the above manufacturing example, the crystal growth layer 31 is dry-etched until the semiconductor wafer 30. However, it is not necessary to remove the crystal growth layer 31 until the semiconductor wafer 30. In this case, it is necessary to etch the crystal growth layer 31 until at least a light emitting layer is removed.

FIGS. 19 and 20 are views schematically showing manufacturing processes of the light emitting element shown in FIG. 14 and the array-shaped light source shown in FIG. 16.

In a manufacturing process example shown in FIGS. 19a to 19f, a crystal growth layer 31 as a semiconductor layer including at least a double hetero structure is first formed on a semiconductor wafer 30 by MO-VPE as mentioned above as shown in FIG. 19a. Thereafter, an etching mask 32 having a shape of the semiconductor layer 2 and an etching mask 37 having the shape of a structure for light interruption or a structure for reflection are simultaneously made by photolithography as shown in FIG. 19b. Next, the crystal growth layer 31 is processed in the shape of the etching mask 32 by dry etching using chlorine so that the crystal growth layer 31 is formed as the semiconductor layer 2 as shown in FIG. 19c. At this time, the structure for light interruption or the structure for reflection 13 is simultaneously formed as shown in FIG. 19f. The etching masks 32 and 37 are removed after the semiconductor layer 2 and the structure for light interruption or reflection are formed.

Thereafter, as shown in FIG. 20a, an insulating film 33 of SiO₂ is deposited on an entire light emitting element by PE-CVD such that this insulating film 33 has 2000 Å in thickness. Next, as shown in FIG. 20b, a contact hole 34 is formed in a predetermined portion of the semiconductor layer 2 by photolithography and wet etching. Thereafter, aluminum wiring 35 having 1 μm in thickness is formed. In this case, an ohmic electrode 35 is formed in the contact hole 34 and a bonding pad 36 is formed in a rear portion of the light emitting element as shown in FIG. 20c. Thereafter, an electrode is formed on a rear face of the light emitting element so that the light emitting element shown in FIG. 14 is completely manufactured. In such processes, the light emitting element shown in FIG. 14 can be simply manufactured. Namely, the structure for light interruption or reflection can be made without adding a process for making this structure so that a light emitting element having high performance can be made very simply. In other words, the structure for light interruption or reflection can be simultaneously formed together with formation of the semiconductor layer using drying etching. Accordingly, it is not necessary to add a process for forming the structure for light interruption or reflection. Therefore, yield can be improved by simplifying the manufacturing processes.

The array-shaped light source shown in FIG. 16 can be manufactured by using the above etching masks 32 and 37 such that the semiconductor layers and the structure for light interruption or reflection are suitably aligned in an array shape. In the above manufacturing example, the crystal growth layer 31 is dry-etched until the semiconductor wafer 30. However, it is not necessary to remove the crystal growth layer 31 until the semiconductor wafer 30. In this case, it is necessary to etch the crystal growth layer 31 until at least a light emitting layer is removed.

FIG. 21 is a view showing an example of the construction of an optical signal transmitter in the present invention. For example, this optical signal transmitter is constructed by coupling the array-shaped light source 111 and the optical fiber array 112 to each other as shown in FIG. 16. FIG. 22 is a cross-sectional view of the optical signal transmitter shown in FIG. 21. With reference to FIGS. 21 and 22, an arranging pitch of plural optical fibers 11 is prescribed in this optical signal transmitter and these optical fibers 11 are respectively fitted into grooves 42 for aligning the optical fibers and formed in a substrate 41 for aligning the optical fibers. In addition to these optical fibers 11, the light emitting elements 1 of the array-shaped light source 111 shown in FIG. 16 are respectively aligned with corresponding optical fibers 11 within the grooves 42 for aligning the optical fibers and formed in the substrate 41 for aligning the optical fibers. More particularly, the light emitting elements 1 and the optical fibers 11 are respectively arranged within the grooves 42 such that the semiconductor layers (light emitting layers) 2 of the light emitting elements 1 are aligned with the optical fibers 11.

Concretely, the grooves 42 for aligning the optical fibers and formed on the substrate 41 for aligning the optical fibers are arranged at a pitch of 250 µm. Accordingly, the plural optical fibers 11 and the respective light emitting elements 1 corresponding to these optical fibers are aligned at a pitch of 250 µm. More concretely, the light emitting elements 1 are arranged and fitted into the grooves 42 such that structures 13-1 and 13-2 for reflection are engaged with side walls of the grooves 42 for aligning the optical fibers. In such an optical signal transmitter, for example, the optical fibers 11 are arranged within the grooves 42 formed on the substrate 41 for aligning the optical fibers. Thereafter, the structures for reflection of the light emitting elements 1 are respectively fitted into the grooves 42 for aligning the optical fibers such that light emitting faces of the light emitting elements 1 are respectively opposed to light receiving faces of the optical fibers. Next, positions of the light emitting elements 1 within the grooves 42 are adjusted and fixed such that the optical fibers 11 and the light emitting elements 1 respectively approach each other as much as possible. Thus, optical axes of the optical fibers and the light emitting diodes can be adjusted. In this case, the structures 13-1 and 13-2 for reflection of the light emitting elements 1 are engaged with the grooves 42 for aligning the optical fibers. The semiconductor layers 2 of the light emitting elements 1 are respectively sufficiently separated from the grooves 42 for aligning the optical fibers. Accordingly, no semiconductor layers 2 are damaged in contact with the grooves 42 even when the above positioning operation is performed. Therefore, the light emitting elements can be stably operated after the light emitting elements are respectively coupled to the optical fibers.

As mentioned above, in the optical signal transmitter of the present invention, it is sufficient to fit an optical fiber 11 and a corresponding light emitting element 1 into one groove 42 and adjust a position of the light emitting element 1. Accordingly, when the optical signal transmitter is assembled, optical axes of the optical fiber and the array-shaped light source are adjusted and positioned very easily. The optical signal transmitter having such a structure has high coupling efficiency of the light emitting element and the optical fiber so that data can be transmitted with high efficiency.

In accordance with a first construction of the present invention, a light emitting element comprises plural semiconductor layers including a light emitting layer and formed on one principal surface of a semiconductor substrate, and is constructed such that at least one portion of end faces of the plural semiconductor layers including the light emitting layer is set to a light emitting end face;

plural light emitting end faces are formed in the light emitting element; and angles formed between mutual adjacent end faces of the respective light emitting end faces are set such that lights emitted from at least two light emitting end faces among the plural light emitting end faces are mutually synthesized. Accordingly, lights from the plural light emitting end faces can be synthesized and emitted. Thus, an amount of light emitted in a forward direction of the light emitting element and an output of this light can be increased. Accordingly, the synthetic light of this light emitting element can be incident to an optical fiber with high efficiency so that coupling efficiency of the light emitting element and the optical fiber can be increased.

In accordance with a second construction of the present invention, the semiconductor layers have five end faces and at least two end faces among these five end faces are set to light emitting end faces. Therefore, an electrode forming portion can be formed by separating the electrode forming portion from the light emitting end faces even when the light emitting element has a small area (volume). Accordingly, this light emitting element is suitable for a compact structure. Further, coupling efficiency of the light emitting element and the optical fiber can be increased although the light emitting element is suitable for a compact structure.

In accordance with a third construction of the present invention, the semiconductor layers have three end faces and at least two end faces among these three end faces are set to light emitting end faces. Accordingly, an area of each of the light emitting end faces can be increased with respect to a volume of the light emitting element so that light emitting efficiency of the light emitting element is high and the light emitting element is suitably made compact.

In accordance with a fourth construction of the present invention, the plural semiconductor layers including the light emitting layer and formed on one principal surface of the semiconductor substrate satisfy the following relation $Eg2 > Eg1$ and $Eg3 > Eg1$ when Eg1 is set to band gap energy of the light emitting layer and Eg2 and Eg3 are set to band gap energies of layers located on both sides of the light emitting layer. Each of these both side layers has a double hetero layer structure of first and second conductivity types. Accordingly, a radiation angular distribution is narrowed by confinement of light in a vertical direction. The radiation angular distribution is widened in a horizontal direction since there is no confinement of light in the horizontal direction. Thus, coupling efficiency of the light emitting element and an optical fiber can be increased by synthesis of light in the horizontal direction.

In accordance with a fifth construction of the present invention, when synthetic light of lights emitted from at least two light emitting end faces among the plural light emitting end faces is directed in a forward direction of the semiconductor layers, a structure for light interruption for preventing light emitted from each of the light emitting end faces from being stray light is arranged on each of sides of the semiconductor layers. Accordingly, a light component on a side of the light emitting element among synthetic light of lights from the plural light emitting end faces can be interrupted on a light interrupting plane. Thus, coupling efficiency of the light emitting element and an optical fiber can be increased and crosstalk of light can be reduced.

In accordance with a sixth construction of the present invention, the angle of a partial plane of the structure for light interruption is set such that light from each of the light emitting end faces is directed forward and reflected on this plane when this light is incident to this plane. The structure for light interruption functions as a structure for reflection having a plane for light reflection. Accordingly, a light component on a side of the light emitting element among synthetic light of lights from the plural light emitting end faces can be deflected on a light reflecting plane in a forward direction of the light emitting element. Thus, coupling efficiency of the light emitting element and an optical fiber can be further increased and crosstalk of light can be reduced.

In accordance with a seventh construction of the present invention, it is possible to obtain an array-shaped light source in which light emitting elements each having high coupling efficiency to an optical fiber are precisely aligned with each other.

An eighth construction of the present invention relates to a method for manufacturing an array-shaped light source by aligning plural light emitting elements with each other. Each of the plural light emitting elements comprises plural semiconductor layers including a light emitting layer and formed on one principal surface of a semiconductor substrate, and is constructed such that at least one portion of end faces of the plural semiconductor layers including the light emitting layer is set to a light emitting end face. Plural light emitting end faces are formed in the light emitting element. Angles formed between mutual adjacent end faces of the respective light emitting end faces are set such that lights emitted from at least two light emitting end faces among the plural light emitting end faces are mutually synthesized. The manufacturing method comprises the steps of growing a crystal growth layer including at least a double hetero layer structure as an epitaxial crystal on one principal surface of the semiconductor substrate; and etching the crystal growth layer by photolithography by using an etching mask having a shape for suitably aligning the crystal growth layer in an array shape so that the semiconductor layers are formed. Accordingly, the plural light emitting end faces of the semiconductor layers can be formed simultaneously, precisely and easily. Therefore, an array-shaped light source having high coupling efficiency to an optical fiber can be easily made.

In accordance with a ninth construction of the present invention, a structure for reflection or a structure for light interruption in addition to the semiconductor layers is suitably aligned in an array shape with the etching mask. The array-shaped light source having the light emitting elements aligned with each other in an array shape and the structure for reflection or light interruption is manufactured by using the etching mask. Accordingly, the plural light emitting end faces of the semiconductor layers and the structure for light interruption or reflection can be formed simultaneously, precisely and easily. Further, it is possible to easily make an array-shaped light source with high coupling efficiency to an optical fiber and reduced crosstalk of light.

A tenth construction of the present invention relates to an optical signal transmitter in which a groove for aligning an optical fiber is formed on a predetermined substrate. The optical fiber and a light emitting element are fitted into the groove. The light emitting element and the optical fiber are arranged such that a light emitting face of the light emitting element and a light receiving face of the optical fiber are aligned with each other within the groove. Accordingly, an optical transmitter having high performance can be precisely assembled by a simple process.

Many widely different embodiments of the present invention may be constructed without departing from the spirit and scope of the present invention. It should be understood that the present invention is not limited to the specific embodiments described in the specification, except as defined in the appended claims.

What is claimed is:

1. A light emitting element comprising:

a plurality of semiconductor layers formed on a principal surface of a semiconductor substrate in a stacked arrangement and constructed such that at least one layer of the plurality of semiconductor layers is a light emitting layer;

a plurality of end faces formed in the stacked arrangement of semiconductor layers such that each of the plurality of end faces form a planar facet oriented perpendicular to the principal surface of the semiconductor substrate; and a plurality of light emitting end faces selected from the plurality of end faces, wherein angles formed between adjacent light emitting end faces are set such that light emitted from at least two of the light emitting end faces of the plurality of light emitting end faces are mutually combined.

2. A light emitting element as claimed in claim 1, wherein the stacked arrangement of semiconductor layers has five end faces and at least two end faces of these five end faces are light emitting end faces.

3. A light emitting element as claimed in claim 1, wherein the stacked arrangement of semiconductor layers has three end faces and at least two end faces of these three end faces are light emitting end faces.

4. A light emitting element as claimed in claim 1, wherein the plurality of semiconductor layers including the light emitting layer satisfies the relation $Eg2 > Eg1$ and $Eg3 > Eg1$ where $Eg1$ is a band gap energy of the light emitting layer and $Eg2$ and $Eg3$ are band gap energies of respective layers located adjacent to each side of the light emitting layer, one of the respective layers located adjacent to and above the light emitting layer and the other of the respective layers located adjacent to and below the light emitting layer, and the plurality of semiconductor layers has a double hetero layer structure where the layer located adjacent to and above the light emitting layer is of a first conductivity type and the layer located adjacent to and below the light emitting layer is of a second conductivity type.

5. A light emitting element as claimed in claim 1, wherein the stacked arrangement of semiconductor layers has a forward direction directed towards a light receiving device such that the mutually combined light emitted from the at least two light emitting end faces is directed in the forward direction, and further including a structure for light interruption that prevents stray light emitted from the at least two light emitting end faces from travelling beyond the structure, the structure being formed on at least one side of the stacked arrangement of semiconductor layers and oriented perpendicular to the principal surface of the semiconductor substrate.

6. A light emitting element as claimed in claim 5, wherein a portion of the structure for light interruption has a planar surface oriented such that light from the plurality of light emitting end faces that is incident on the planar surface is reflected therefrom in the forward direction toward the light receiving device.

7. An array-shaped light source comprising:

a plurality of light emitting elements aligned relative to each other in an array on a semiconductor substrate, each of the plurality of light emitting elements comprising a plurality of semiconductor layers being formed on a principal surface of the semiconductor substrate in a stacked arrangement and constructed such that at least one layer of the plurality of semiconductor layers is a light emitting layer;

a plurality of end faces formed in the stacked arrangement of semiconductor layers such that each of the plurality of end faces form a planar facet oriented perpendicular to the principal surface of the semiconductor substrate; and a plurality of light emitting end faces selected from the plurality of end faces, wherein angles formed between adjacent light emitting end faces are set such that light emitted from at least two of the light emitting end faces of the plurality of light emitting end faces are mutually combined.

* * * * *